United States Patent
Asai et al.

(10) Patent No.: US 6,534,723 B1
(45) Date of Patent: Mar. 18, 2003

(54) MULTILAYER PRINTED-CIRCUIT BOARD AND SEMICONDUCTOR DEVICE

(75) Inventors: Motoo Asai, Gifu (JP); Takashi Kariya, Gifu (JP)

(73) Assignee: Ibiden Co., Ltd., Gifu (JP)

( * ) Notice: Subject to any disclaimer, the term of this patent is extended or adjusted under 35 U.S.C. 154(b) by 0 days.

(21) Appl. No.: 09/821,460

(22) PCT Filed: Nov. 24, 2000

(86) PCT No.: PCT/JP00/08291

§ 371 (c)(1),
(2), (4) Date: Apr. 6, 2001

(87) PCT Pub. No.: WO01/39267

PCT Pub. Date: May 31, 2001

(30) Foreign Application Priority Data

| Nov. 26, 1999 | (JP) | ............................................ | 11-335534 |
| Aug. 14, 2000 | (JP) | ....................................... | 2000-245648 |
| Aug. 14, 2000 | (JP) | ....................................... | 2000-245649 |
| Aug. 14, 2000 | (JP) | ....................................... | 2000-245650 |
| Aug. 14, 2000 | (JP) | ....................................... | 2000-245656 |

(51) Int. Cl.[7] .............................. H05K 1/03; H05K 1/16
(52) U.S. Cl. ........................ 174/255; 174/258; 174/261; 174/262; 361/782; 361/792; 361/794; 257/737; 257/778
(58) Field of Search ................................. 174/255, 260, 174/258, 259, 261, 262, 264, 266, 267, 256, 52.4; 361/760, 763, 764, 767, 774, 782, 783, 792, 793, 794, 795, 803, 807; 257/737, 738, 778, 700

(56) References Cited

U.S. PATENT DOCUMENTS 3,471,631 A * 10/1969 Quintana ..................... 174/264

(List continued on next page.)

FOREIGN PATENT DOCUMENTS

JP 5-198946 8/1993

(List continued on next page.)

OTHER PUBLICATIONS

Surface Mount Technology, vol. 7, No. 1, Jan. 1997—Including English translation of Fig. 1, on p. 3; Fig. 2 on p. 4 in the article "Remarkable Movement in Developing Build–up Multilayer Printed Wiring Board" (by Kiyoshi Takagi; pp. 2–10).

*Primary Examiner*—Albert W. Paladini
*Assistant Examiner*—I B Patel
(74) *Attorney, Agent, or Firm*—Greenblum & Bernstein, P.L.C.

(57) ABSTRACT

A multilayer printed-circuit board is provided which is formed by stacking one on the other a plurality of circuit boards, each including a hard insulative substrate having a conductor circuit formed on one or either side thereof, and having formed therein via-holes formed through the hard insulative substrate to extend to the conductor circuit and each filled with a conductive substance, with an adhesive applied between the plurality of circuit boards, and heating and pressing the circuit boards together. One of the outermost ones of the stacked circuit boards has formed on the surface thereof conductive bumps each positioned right above the via-hole and electrically connected to the via-hole, and the other outermost one of the stacked circuit boards has formed on the surface thereof conductive pin or balls each positioned right above the via-hole and electrically connected to the via-hole. This multilayer printed-circuit board is used as a package circuit board and electronic components such as LSI chip are mounted on it to form a semiconductor device. The multilayer printed-circuit board is used as a core substrate, and a build-up wiring layer is formed on one or either side of the core multilayer circuit board. Solder bumps are formed on the surface of one outermost conductor circuit of the build-up wiring layer and conductive pins or balls are provided on the surface of the other outermost conductor circuit of the build-up wiring layer. Thus, a multilayer printed-circuit board is provided on which wiring can be made densely and also electronic components can be mounted with a high density.

28 Claims, 13 Drawing Sheets

U.S. PATENT DOCUMENTS

| | | | | |
|---|---|---|---|---|
| 4,349,862 A | * | 9/1982 | Bajorek et al. | 361/762 |
| 5,292,574 A | * | 3/1994 | Kata et al. | 428/209 |
| 5,373,110 A | * | 12/1994 | Inasaka | 174/267 |
| 5,375,042 A | * | 12/1994 | Arima et al. | 361/784 |
| 5,590,461 A | * | 1/1997 | Ishida | 29/830 |
| 5,726,863 A | * | 3/1998 | Nakayama et al. | 361/794 |
| 5,939,789 A | * | 8/1999 | Kawai et al. | 257/758 |
| 5,977,490 A | * | 11/1999 | Kawakita et al. | 174/265 |
| 6,139,777 A | * | 10/2000 | Omaya et al. | 252/500 |
| 6,217,987 B1 | * | 4/2001 | Ono et al. | 428/209 |
| 6,259,037 B1 | * | 7/2001 | Feilchenfeld et al. | 174/260 |

FOREIGN PATENT DOCUMENTS

| | | | |
|---|---|---|---|
| JP | 406077344 A | * | 3/1994 |
| JP | 09017828 | | 1/1997 |
| JP | 11214846 | | 8/1999 |
| JP | 411238972 A | * | 8/1999 |
| JP | 11307936 | | 11/1999 |
| JP | 2000-003980 | | 1/2000 |
| JP | 2000-091748 | | 3/2000 |
| WO | WO01/39267 | | 5/2001 |

* cited by examiner

MULTILAYER PRINTED-CIRCUIT BOARD AND SEMICONDUCTOR DEVICE

TECHNICAL FIELD

The present invention relates to a multilayer printed-circuit board in which wiring can advantageously be done with an ultra-high density, a multilayer-printed-wiring board obtained by forming a build-up printed-wiring layer on the multilayer printed-circuit board, and a semiconductor device including semiconductor components mounted on the multilayer printed-circuit board or multilayer printed-wiring board.

The present invention relates more particularly to a multilayer printed-circuit board formed by stacking a plurality of singe-sided circuit boards one on the other, each having a plurality of filled via-hole formed therein, with an adhesive applied between them, and heating and pressing them together or by laminating a single-sided circuit board on either side of a double-sided circuit board as a core with an adhesive applied between the single-side circuit boards and double-sided circuit board, and heating and pressing the circuit boards together, a multilayer printed-wiring board obtained by forming a build-up wiring layer on at least one side of the multilayer printed-circuit board, and a semiconductor device using the multilayer printed-circuit board or multilayer printed-wiring board.

BACKGROUND ART

Along with the recent innovation of the electronic technology, the electronic devices have been designed to have a reduced physical size and operate at a higher speed, and thus the package circuit board on which IC chips are mounted has been required to have a correspondingly higher packaging density due to a finer pattern and operate with a correspondingly higher reliability.

Such a package circuit board is known from the disclosure in the monthly journal "Surface Mount Technology", January issue, 1997. This conventional package circuit board has a build-up multilayer wiring layer formed on either side of a multilayer core circuit board.

In the above conventional package circuit board, however, a conductor layer in a multilayer core circuit board and build-up multilayer wiring layer are connected to each other by providing on the surface of the core multilayer circuit board an inner pad wired from through-holes and connecting via-holes to the inner pad. Thus, the land of each through-hole takes the form of a dumbbell or the like, the inner pad hinders through-holes from being disposed with an improved higher density, and only a limited number of through-holes can be formed. Hence, if the core circuit board is formed multilayered to increase the wiring density, it is not possible to assure a sufficient electrical connection between outer build-up wiring layers and conductor layers in the multilayer core circuit board.

The Inventors of the present invention proposed a method for overcoming the above-mentioned drawbacks of the prior art in the Japanese Patent Application No. 10-15346 (Unexamined Patent Publication No. 214846/'99).

The multilayer printed-wiring board disclosed by the Inventors of the present invention in the above Unexamined Patent Publication No. 214846/'99 includes a build-up wiring layer formed by stacking interlinear insulative resin layers and conductor layers alternately one on the other on a multilayer core circuit board having an inner conductor layer and connecting the conductor layers to each other by via-holes, the core multilayer circuit board having formed therein through-holes each filled with a filler, a conductor layer being formed to cover an exposed surface of the filler from the through-holes, the via-holes being connected to the conductor layer, whereby the through-holes are disposed with an improved density and the conductor layer can positively be connected to the conductor circuit in the core multilayer circuit board via the through-holes disposed with the high density.

However, the through-hole in the multilayer printed-wiring board is formed by forming holes through a core multilayer circuit board using a drill or the like and by electroless-plating the wall surface and board surface of the drilled hole. Thus, when the precision and cost of forming the through-hole are taken in consideration, the lower limit of the opening diameter of such a through-hole is on the order of 300 $\mu$m. To realize the ultrahigh density of wiring demanded from the present electronic industries, there should desirably developed techniques capable of attaining a smaller opening diameter of the through-hole ranging from 50 to 250 $\mu$m and a smaller through-hole land pitch.

To meet the above demand, the Inventors of the present invention formed a core multilayer circuit board by preparing a plurality of circuit boards having a conductor circuit formed on one or either side of a core substrate made of a hard material and a plurality of filled via-hole formed through the core substrate to extend from the one side thereof to the conductor circuit, by stacking the plurality of circuit boards one on the other with an adhesive applied between them, and then heating and pressing of the circuit boards together. With this core multilayer circuit board, it was found that even with the no through-hole provided in the core multilayer circuit board, sufficient electrical connections can be made between the conductor circuits in the core multilayer circuit board, and conductor circuits in the core multilayer circuit board and build-up wiring layers formed on the core multilayer circuit board, by a plurality of filled via-hole formed in the core multilayer circuit board and those formed in the build-up wiring layer right above the core multilayer circuit board.

The multilayer printed-circuit board has various electronic components including a semiconductor chip such as LSI and the other mounted on the outermost surface thereof. The methods of mounting the electronic components include a pin mounting technology in which part holes into which terminals of the electronic component are to be introduced are formed in place on the conductor circuit formed on the outermost surface while connection lands whose diameter is slightly larger than that of the part hole are formed around the part holes, and a group of leads of the electronic component is connected, by soldering, to the part holes and connection lands, and a surface mounting technology in which a cream solder is applied to a land formed in place on the conductor circuit in advance, terminals of an electronic component are placed in contact with the cream solder and then the cream solder is made to reflow in an atmosphere maintained at the melting temperature of the solder to connect the electronic component.

When any of such mounting methods is employed to connect an electronic component, however, it is indispensable to form on the conductor circuit a land having an appropriate diameter. Nevertheless, in case an increased number of electronic components is to be mounted on the multilayer printed-circuit board because of the reduced physical sizes and higher functions of the recent electronic devices, the total area of such lands has to be too large to neglect, which stands in the way of attaining a higher packaging density.

Also, when soldering for connection of an electronic component, it is indispensable to previously apply a solder resist to the electronic component in order to prevent a melted solder from flowing to an unintended position where such flow is not desirable and causing a short-circuit, break or the like. Thus, the multilayer printed-circuit board has to be designed for an extra gap between wires with consideration given to a possible misregistration in the solder resist printing, which also stands in the way of attaining the higher packing density.

SUMMARY OF THE INVENTION

Accordingly, the present invention has an object to overcome the above-mentioned drawbacks of the prior art by providing a multilayer printed-circuit board and multilayer printed-wiring board in which wiring can be done with a high density and on which electronic components can be mounted with a high density, and a semiconductor device using the multilayer printed-circuit board and wiring board.

The Inventors of the present invention have made various studies to attain the above object, and worked out the following inventions which will be outlined herebelow:

(1) The above object can be attained by providing a multilayer printed-circuit board formed by stacking one on the other a plurality of circuit boards, each including a hard insulative substrate having a conductor circuit formed on one or either side thereof, and having formed therein at least one via-hole being a hole formed through the hard insulative substrate to extend to the conductor circuit and each filled with a conductive substance, with an adhesive applied between the plurality of circuit boards, and heating and pressing the circuit boards together, one of the outermost ones of the stacked circuit boards having formed on the surface thereof at least one conductive bump positioned right above the via-hole and electrically connected to the via-hole; and the other outermost one of the stacked circuit boards having formed on the surface thereof at least one conductive pin or ball positioned right above the via-hole and electrically connected to the via-hole.

(2) Also the above object can be attained by providing a multilayer printed-circuit board formed by stacking one on the other:

a plurality of single-sided circuit boards, each including a hard insulative substrate having a conductor circuit formed on one side thereof, and having formed therein at least one via-hole being a hole formed through the hard insulative substrate to extend to the conductor circuit and each filled with a conductive substance; and a single-sided circuit board including a hard insulative substrate having at least one conductor circuit formed on one side thereof and at least one hole formed through the hard insulative substrate to extend to the conductor circuit, with an adhesive applied between the single-sided circuit boards, and heating and pressing the single-sided circuit boards together, one of the outermost ones of the stacked circuit boards having formed on the surface thereof at least one conductive bump positioned right above the via-hole and electrically connected to the via-hole; and the other outermost one of the stacked circuit boards having formed on the surface thereof at least one conductive pin or ball positioned right above the via-hole and electrically connected to the via-hole.

Preferably in the multilayer printed-circuit board described in the above paragraph (1), one of the outermost ones of the plurality of circuit boards should have formed on the surface thereof a solder resist layer covering the conductor circuit, and right above the via-hole a conductive bump connecting to a conductive layer or via-hole exposed from a hole formed in the solder resist layer, and the other outermost circuit board should have formed on the surface thereof a solder resist layer covering the conductor circuit, and right above the via-hole a conductive pin or ball connecting to a conductive layer or via-hole exposed from a hole formed in the solder resist layer.

In the multilayer printed-circuit boards described in the above paragraph (1) or (2), the distance between the neighboring via-holes formed in each of the circuit boards should desirably be increased as it goes from one of the circuit boards towards the other.

(3) Also the object can be attained by providing a semiconductor device including the above multilayer printed-circuit board described in the above paragraph (1) or (2) and at least one electronic component electrically connected to the conductive bumps formed on one of the outermost circuit boards of the multilayer printed-circuit board.

In the semiconductor device described in the above paragraph (3), it is desirable that the circuit board on which at least one electronic component is mounted should have a stiffer provided along the circumference thereof and a chip capacitor should be electrically connected to the one of the via-holes formed in the outermost circuit board opposite to that outermost circuit board on which the electronic component is mounted and which is located in a position opposite to the position where the electronic component is mounted.

(4) Also the above object can be attained by providing a semiconductor device including a multilayer printed-circuit board formed by stacking one on the other a plurality of circuit boards, each including a hard insulative substrate having at least one conductor circuit formed on one or either side thereof, having formed therein at least one via-hole being a hole formed through the hard insulative substrate to extend to the conductor circuit and each filled with an electro-plating substance, and including at least one projecting conductor, each electrically connected to the via-hole, with an adhesive applied between the plurality of circuit boards, and heating and pressing the circuit boards together, and at least one electronic component such as LSI chip, electrically connected to the outermost circuit board of the multilayer printed-circuit board, one of the outermost ones of the stacked circuit boards having formed on the surface thereof at least one conductive bump positioned right above the via-hole and each electrically connected to the via-hole, and the electronic component being electrically connected to the conductive bumps;

the other outermost circuit board opposite to the outermost circuit board on which the electronic component is mounted having provided on the surface thereof at least one chip capacitor, each electrically connected to the via-hole positioned beneath the electronic component.

In the semiconductor device described in the above paragraph (4), the circuit board on which the electronic component is mounted should desirably have a board warp-preventive stiffener secured by bonding to the circumference thereof.

(5) Also the above object can be attained by providing a multilayer printed-circuit board including a core multilayer circuit board having an inner conductor circuit, having formed on one or either side thereof a build-up wiring layer formed from interlaminar insulative resin layers and conductor layers alternately stacked one on the other, the conductor layers being connected to each other by at least one via-hole, the core multilayer circuit board being formed by stacking one on the other a plurality of circuit boards, each including a hard insulative substrate having at least one conductor circuit formed on one or either side thereof, and having formed therein at least one via-hole being a hole formed through the hard insulative substrate to extend to the conductor circuit and each filled with a conductive substance, with an adhesive applied between the plurality of circuit boards, and heating and pressing the circuit boards together.

In the multilayer printed-circuit board described in the above paragraph (5), it is desirable that the build-up wiring layer should be formed on either side of the core multilayer circuit board, the outermost conductor layer forming one of the build-up wiring layers have at least one solder bump formed on the surface thereof and the other outermost conductor layer forming the other build-up wiring layer have at least one conductive pin or ball formed on the surface thereof.

Also, according to the present invention, there is provided a multilayer printed-wiring board suitable for use as a mother board, in which the outermost conductor layers forming the build-up wiring layer are covered each with a solder resist layer and the outermost conductor layer exposed from the hole formed in the solder resist layer is formed as a conductor pad (or in the form of a connection terminal).

Also in the multilayer printed-circuit board described in the above paragraph (5), it is desirable that the build-up wiring layer should be formed on one side of the core multilayer circuit board, at least one solder bump to be connected to an electronic component including a semiconductor chip such as LSI be provided right above the via-hole on the surface of the outermost conductor layer of the build-up wiring layer, and at least one conductive pin or ball to be connected to a mother board be provided right above the filled via-hole on the conductor circuit exposed on the other side of the core multilayer circuit board. Also, it is desirable that the outermost conductor layer forming the build-up wiring layer and the other side of the core multilayer circuit board should be covered with a solder resist layer, at least one conductor pad be formed on one of the outermost conductive layers, each exposed from a hole formed in the solder resist layer, and at least one conductive pint or ball to be connected to a mother board be formed right above the filled via-hole on the conductor circuit exposed on the other side of the core multilayer circuit board.

In the multilayer printed-circuit boards described in the above paragraphs (1) to (5), the conductive substance should desirably be a metal-plating produced by electro-plating or a conductive paste comprising metal particles and thermosetting or thermoplastic resin.

In the multilayer printed-circuit boards described in the above paragraphs (1) to (5), it is desirable that each circuit board forming the core multilayer circuit board should have at least one projecting conductor provided in a position corresponding to the via-hole and electrically connected to the via-hole and also the projecting conductor be formed from a conductive paste.

Further in the multilayer printed-circuit boards described in the above paragraphs (1) to (5), it is desirable that a part of the via-holes in the build-up wiring layer should be positioned right above those formed in the core multilayer circuit board and connected directly to the via-hole.

Furthermore, in the multilayer printed-circuit boards described in the above paragraphs (1) to (5), it is desirable that the single-/double-sided circuit board as a basic unit forming the core multilayer circuit board should be formed from a selected one of hard substrate materials such as glass epoxy resin, glass bismaleimide-triazine resin, glass polyphenylene ether resin, aramid non-woven fabric-epoxy resin and aramid non-woven fabric-polyimide resin. Also, the circuit board should desirably be formed from a glass epoxy resin of 20 to 100 $\mu$m in thickness and the filled via-hole should desirably have a diameter of 50 to 250 $\mu$m.

Moreover, the via-hole in each circuit board should desirably be formed from a hole formed by illuminating the surface of the glass epoxy resin substrate with 1 to 50 shots of a carbon-dioxide gas laser whose pulse energy is 0.5 to 100 mJ, pulse width is 1 to 100 $\mu$s, pulse interval is 0.5 ms or more.

These objects and other objects, features and advantages of the present intention will become more apparent from the following detailed description of the preferred embodiments of the present invention when taken in conjunction with the accompanying drawings.

BEST MODE FOR CARRYING OUT THE INVENTION (1) The present invention is characterized, according to the present invention, in that a plurality of single- or double-sided circuit boards, each formed as a basic composition from a hard insulative substrate and having at least one conductor circuit formed on one or either side of the hard insulative substrate and at least one via-hole being a hole formed through the hard insulative substrate to extend to the conductor circuit and each filled with a conductive substance, is appropriately combined with each other or combined, as necessary, with a circuit board having formed therein at least one via-hole being a hole, each filled with a conductive substance, but having no conductor circuit, they are stacked one on the other with an adhesive applied besetment them and hot pressed together to provide a multilayer printed-circuit board as a package circuit board.

More specifically, an outermost one of the plurality of circuit boards stacked one on the other and hot pressed together has formed on the surface thereof at least one conductive bump positioned right above the via-hole for connection to connection terminals of an electronic component and electrically connected to the via-hole, and the other outermost circuit board has provided on the surface thereof at least one conductive pin (PGA) or ball (BGA) positioned right above the via-hole and electrically connected to the via-hole so as to be connectable to a connection hole or connection pad provided on a mother board.

Figure 1:
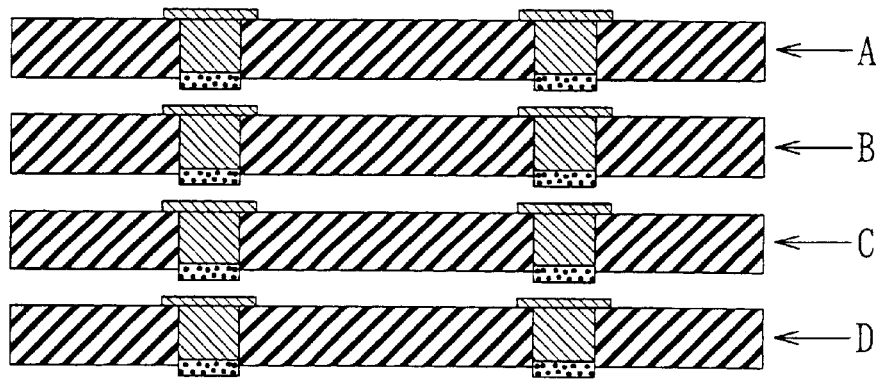
FIG. 1 shows one example of the stacked state of the single-sided circuit boards forming the multilayer printed-circuit board according to the present invention.
Figure 2:
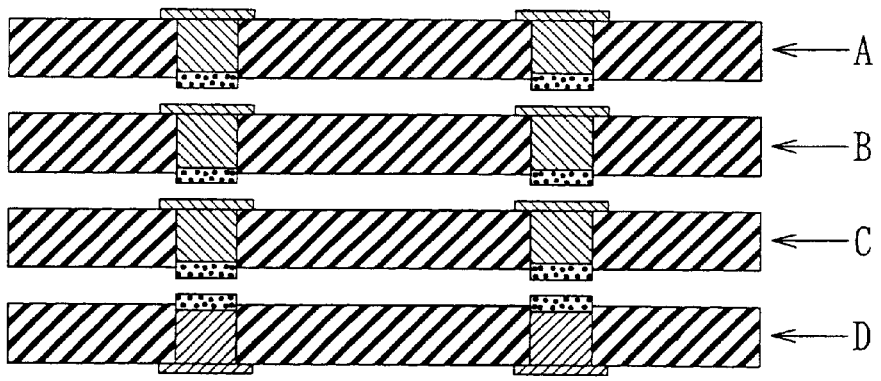
FIG. 2 shows another example of the stacked state of the single-sided circuit boards forming the multilayer printed-circuit board according to the present invention.

(a) In case the above multilayer printed-circuit board is constructed of four single-side circuit boards A to D for example, the conductor circuit is exposed on the surface of the circuit board A at one outermost position and the projecting conductor connected to the via-hole is exposed on the surface of the circuit board D at the other outermost position, as shown in FIG. 1 for example. As shown in FIG. 2 for example, the conductor circuit is exposed on the surface of each of the circuit boards A and D located at the outermost positions, respectively.

Figure 3:
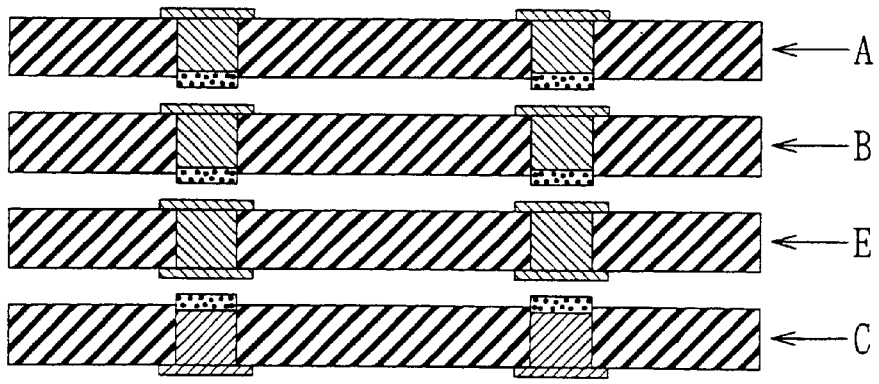
FIG. 3 shows a still another example of the stacked state of the single-sided circuit boards forming the multilayer printed-circuit board according to the present invention.

(b) Also, in case the multilayer printed-circuit board is constructed of three circuit boards A, B and C and a double-sided circuit board E for example, the circuit boards A and C located at the outermost positions, respectively, have their respective conductor circuits exposed on the surfaces thereof as shown in FIG. 3 for example.

Figure 4:
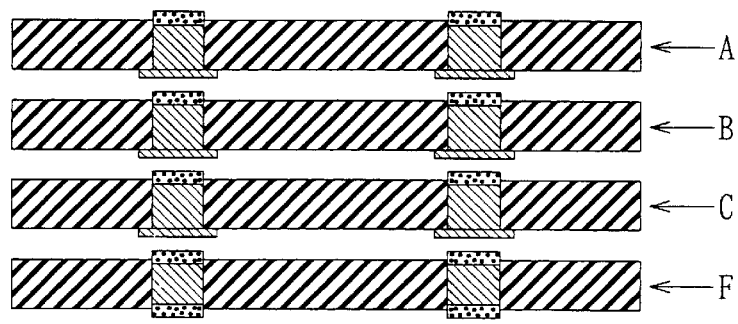
FIG. 4 shows a yet another example of the stacked state of the single-sided circuit boards forming the multilayer printed-circuit board according to the present invention.

(c) Further, in case the multilayer printed-circuit board is constructed of three circuit boards A, B and C and a circuit board E having no conductor circuit for example, the circuit boards A and F located at the outermost positions, respectively, have exposed on the surfaces thereof their respective projecting conductors connected to the via-holes, respectively, as shown in FIG. 4 for example.

The multilayer printed-circuit board may be constructed otherwise than in any of the examples of multilayer printed-circuit board construction (a) to (c). The portion of the conductor circuit of the outermost circuit boards, located right above the via-hole, may be formed as a conductor pad, and the exposed portion of the projecting conductor exposed on the surface of the outermost circuit board be formed as a conductor pad spreading circularly on the surface of the insulative substrate, as a result of melting of the exposed portion during the hot pressing.

Preferably in the construction of the multilayer printed-circuit board shown in FIG. 1, an appropriate solder is supplied to form, on the conductor circuit exposed on the surface of the topmost circuit board, solder bumps which are to be connected to an electronic component including semi-conductor chip such as LSI, and the conductor pads formed from the projecting conductors in the position corresponding to the via-holes on the bottommost circuit board have provided thereon T-shaped pins or solder balls which are to be connected to a connector or connection pad on a mother board.

Also, an appropriate solder may be supplied onto the conductor circuit exposed on the surface of the outermost circuit board to form on the conductor pad formed from the projecting conductor in a position corresponding to the via-hole in the bottommost circuit board a solder bump to which the T-shaped pin or solder ball.

In any of the constructions of the multilayer printed-circuit board, the solder bump will be formed on the conductor pad formed on a portion of the conductor circuit of the outermost one of the circuit boards or on the conductor pad formed from the projecting conductor located right above the via-hole, and the T-shaped pin or solder ball will be provided on the conductor pad formed from the projecting conductor right above the via-hole, exposed on the surface of the other outermost circuit board or on the conductor pad formed on the portion of the conductor circuit.

According to a further aspect of the present invention, a solder resist layer may be provided on the surface of the outermost one of the circuit boards to cover the conductor circuit of the circuit board, and conductor bumps to be connected to the conductor layer or via-holes exposed in a hole formed in the solder resist layer may be formed right above the via-holes, respectively. Also, a solder resist layer may be provided also on the surface of the other outermost circuit board to cover the conductor circuits of the circuit board, and at least one conductive pin or ball to be connected to the conductor layer or via-hole exposed in a hole formed in the solder resist layer may be formed right above the via-hole.

Because of the above multilayer printed-circuit board construction, since the filled via-holes are provided highly densely in the multilayer printed-circuit board and the conductive pin or ball is provided right above the one of the via-holes provided with a high density, exposed on the surface of the outermost circuit board, wiring layers in the multilayer printed-circuit board can be connected over a shortest length to an electronic component including a semiconductor chip such as LSI and a mother board via the conductive bump, pin or ball. Thus, a high density of wiring can be attained.

Further, the multilayer printed-circuit board according to the present invention is advantageous in that since it is formed from stacked single- or double-sided circuit boards each as basic composition, a thermal expansion-caused crack or delamination originating in the interlaminar boundary will not easily take place and so the temperature cycling test proves its high reliability.

Also, advantageously in a multilayer printed-circuit board using only single-sided circuit boards according to the present invention, warp will not easily occur whether wiring is formed or not therein.

Furthermore, in the above embodiment, since the conductive bump, pin or ball is formed right above the via-hole exposed on the surface of the outermost circuit board of the multilayer printed-circuit board, no solder resist layer should necessarily be formed as in the prior art. This is because the insulation layer of the outermost circuit board functions as the solder resist.

(2) Also the multilayer printed-circuit board is characterized, according to the present invention, in that the outermost one of the plurality of stacked circuit boards has formed on the surface thereof at least one conductive bump positioned right above the via-hole and each electrically connected to the via-hole and the other outermost circuit board has no conductive substance filled in the hole formed therein and has provided thereon at least one conductive pin or ball electrically connected to the conductor circuit thereof.

Because of the above construction of the multilayer printed-circuit board, the outermost one of the single-sided circuit boards forming the multilayer printed-circuit board functions as a reinforcing plate having no filled via-hole. This is because the via-hole is smaller than the inner via-land and thus the insulation layer of the outermost circuit board retains the circumference of the via-land while the via-hole is being formed. Further, since the conductive pin or ball is provided in the hole formed in the circuit board so as to electrically be connected to the conductor circuit, no solder resist layer is required.

(3) Also the semiconductor device is characterized, according to the present invention, in that the electronic component such as an LSI is electrically connected to the conductive bumps formed on the outermost circuit board of the multilayer printed-circuit board (1) or (2).

Because of the above construction of the semiconductor device, the conductive bump can be kept flat, so no connection or poor connection will take place between the conductive bumps and electronic components.

In the semiconductor device, it is desired that the circuit board on which at least one electronic component is to be mounted should have a stiffener along the circumference thereof to enclose each of the electronic components, and a chip capacitor should be connected directly to one of the via-holes formed in the outermost circuit board opposite to the electronic component mounting circuit board, which is positioned opposite to the position where the electronic component is mounted.

Because of the above construction of the multilayer printed-circuit board, the distance between the electronic component such as LSI and the chip capacitor can be minimized and the loop inductance between them can be reduced.

(4) The semiconductor device including a multilayer printed-circuit board formed by stacking together, and heating and pressing, a plurality of single-sided circuit boards in which filled via-holes are formed by electro-plating, and electronic components such as LSI chips electrically connected to the outermost circuit board of the multilayer printed-circuit, the semiconductor device is characterized, according to the present invention, in that:

the outermost one of the circuit boards has formed on the surface thereof at least one conductive bump each positioned right above the via-hole and connected electrically to the via-hole, the electronic component is electrically connected to the conductive bumps via solder balls, and the other outermost circuit board opposite to the circuit board on which the electronic component is to be mounted has provided on the surface thereof at least one chip capacitor each electrically connected to the via-hole positioned beneath the position of the electronic component.

Because of the above construction of the semiconductor device, the distance between the electronic component such as LSI and the chip capacitor can be minimized and the loop inductance between them can be reduced.

In the above semiconductor device, there should desirably be fixed, by bonding, along the circumference of the circuit board on which electronic components are to be mounted, a stiffener to prevent the entire circuit board from warping due to a difference in coefficient of thermal expansion from one material to the other of the circuit board.

The stiffener should desirably be formed from a glass-resin composite material such as BT, FR4 or FR5, a metallic material such as copper, or the lie and disposed to enclose the electronic component mounted on the circuit board.

(5) The multilayer printed-circuit board is characterized, according to the present invention, in that a plurality of single- or double-sided circuit boards, each formed as a basic composition from a hard insulative substrate and having at least one conductor circuit formed on one or either side of the hard insulative substrate and at least one via-hole being a hole formed through the hard insulative substrate to extend to the conductor circuits and each filled with a conductive substance, is stacked one on the other and hot pressed together and that the multilayer printed-circuit board thus provided is used as a core multilayer circuit board and a build-up wiring layer is formed on one or either side of the core multilayer circuit board.

In the embodiment in which the build-up wiring layer is formed on either side of the core multilayer circuit board, an interlaminar insulative layer and conductor circuit are stacked alternately on either side of the core multilayer circuit board and the conductor circuits are electrically connected to each other by the via-holes. At least a part of the surface of one conductor circuit located at the outermost position of the build-up wiring layer is formed as a conductor pad, and a conductive bump such as solder bump is formed on the conductor pad so as to be connectable to the connection terminal, conductive pin or ball of the electronic component, while at least a part of the surface of the other conductor circuit located at the outermost position of the build-up wiring layer is formed as a conductor pad, and a conductor pin or ball is disposed on the conductor pad so as to be connectable to the connection hole (connector) or connection pad on a mother.

In the above embodiment, a solder resist layer is provided to cover the conductor circuit located at the outermost position of the build-up wiring layer, a part of the conductor circuit, exposed from a hole formed in the solder resist layer is formed as a conductor pad, and a conductive bump, pin or ball is disposed on each conductor pad, to thereby form a multilayer printed-circuit board for a package circuit board suitable for mounting electronic components thereon.

Also in the above embodiment, the solder resist layer is provided to cover the conductor circuit located at the outermost position of the build-up wiring layer and the part of the conductor circuit, exposed in the hole formed in the solder resist layer, is formed as the conductor pad, whereby a multilayer printed-circuit board for a mother board can be provided. In this embodiment, a connector for electrical connection to the package circuit board should desirably be provided on the conductor pad as necessary.

Similarly, in the embodiment in which the build-up wiring layer is formed on one side of the core multilayer circuit board, at least a part of the surface of one circuit board located at the outermost position of the build-up circuit is formed as a conductor pad, and a conductive pad such as a solder bump is formed on the conductor pad as to be connectable to the connection terminal or conductive pin or ball of the electronic component, while at least a part of the surface of the conductor circuit at the side of the core multilayer circuit board where no build-up wiring layer is formed is formed as a conductor pad, and a conductive pin or ball is disposed on the conductor pad so as to be connectable to the connection hole (connector) or connection pad on a mother board.

Because of the construction of each of the above embodiments, it is unnecessary to provide through-holes in the core multilayer circuit board, so the pad such as land can be disposed more freely. Thus, the filled via-holes can be provided at a higher density. The outer build-up wiring layer can securely be connected to the conductor circuit in the core multilayer circuit board via the via-holes formed at a high density and thus wiring can also be made highly densely. Further, a high density of the wiring within the core multilayer circuit board can be attained.

Moreover, since the via-holes are formed at a high density in the build-up wiring layer and a conductive bump, pin or ball is disposed on the conductor pad exposed in the one of the densely formed via-holes in the outermost interlaminar insulative resin layer, the build-up wiring layer in the multilayer printed-circuit board is connected to an electronic component including a semiconductor chip such as LSI and a mother board via the conductive bumps, pins or balls using a shortest wire, whereby a high density wiring and high density mounting of electronic components can be attained.

In the multilayer printed-circuit boards and semiconductor device described in the above paragraphs (1) to (5), the insulative substrate used in the double/single-sided circuit boards forming the multilayer printed-circuit board is not any semi-hard prepreg but a hard insulative substrate formed from a completely cured resin. When a copper foil is applied to the insulative substrate of such a material by pressing, the final thickness of the insulative substrate will not vary due to the force of pressing, so the misregistration of the via-hole can be minimized and the vialand diameter can be reduced. Therefore, the wiring pitch can be reduced and wiring density can be improved. Further, since the thickness of the substrate can be kept constant, laser illumination conditions can easily be set when a hole for a filled via-hole is formed by laser beam machining.

The insulative resin substrate should preferably be formed from a selected one of hard substrate materials such as glass epoxy resin, glass bismaleimide-triazine resin, glass polyphenylene ether resin, aramid non-woven fabric-epoxy resin and aramid non-woven fabric-polyimide resin, and most preferably be formed from the glass epoxy resin.

The thickness of the insulative substrate should desirably be 20 to 600 $\mu$m to assure a sufficient insulation performance. If the thickness is less than 20 $\mu$m, the substrate will have a lower strength and thus be difficult to handle and the reliability of its electrical insulation performance will be lower. If the thickness is over 600 $\mu$m, it will be difficult to form a hole for a fine via-hole and the substrate thickness itself will be increased.

The hole for a via-hole should desirably be formed in the glass epoxy substrate having a thickness within the above range by emitting to the glass epoxy substrate irradiating 1 to 50 shots of a carbon-dioxide gas laser whose pulse energy is 0.5 to 100 mJ, pulse width is 1 to 100 $\mu$s, pulse interval is 0.5 ms or more. The hole diameter should desirably be within a range of 50 to 250 $\mu$m because a diameter of less than 50 $\mu$m will lead to a difficulty of filling of a conductive substance into the hole and a lower reliability of the electrical connection while a diameter of more than 250 $\mu$m will lead to a difficulty of a high density with which the via-holes are formed.

It is desired that before forming the hole with a carbon-dioxide gas laser, a resin film should be attached to a side of the insulative substrate opposite to the side on which the conductor circuit is to be formed and the side be illuminated with the laser from on the resin film.

The resin film serves as a protective mask when filing a metal-plating into the desmeared hole for a via-hole by electro-plating, and also as a printing mask to form a projecting conductor right above the metal-plating layer in the via-hole.

The resin film should desirably be formed from a polyethylene terephthalate (PET) film whose adhesive layer is 1 to 20 $\mu$m in thickness and whose thickness is 10 to 50 $\mu$m.

The reason for the above is that since the height of the projecting conductor depends upon the thickness of the PET film, a thickness of less than 10 $\mu$m will result in an excessively low projecting conductor which will cause a poor connection while a thickness of more than 50 $\mu$m will result in an excessive spreading of the projecting conductor at the boundary of connection and hence in an impossibility to form a fine pattern.

The conductive substance to be filled in the hole formed through the insulative substrate should preferably be a conductive paste or a metal-plating formed by electro-plating.

For simplification of the filing process, reduction of the manufacturing cost and improvement of the field, a conductive paste is suitably usable to fill the via-hole. For an improved reliability of the electrical connection, a metal-plating formed by electro-plating, such as plating of tin, silver, solder, copper/tin, copper/silver or the like should preferably be used, and the hole should most preferably be filled with an electrolytic copper.

The hole thus filled with the conductive substance forms a via-hole which electrically connects conductor circuits formed on the insulative substrates to each other. In the embodiments of the multilayer printed-circuit board as a package circuit board and semiconductor device using the package circuit board according to the present invention, via-holes formed in each of circuit boards stacked one on the other are formed so that the distance between neighboring via-holes is shortest in the outermost circuit board on the side of the multilayer printed-circuit board on which electronic components such as LSI chip are to be mounted while the distance is longest in the other outermost circuit board on the side of the multilayer printed-circuit board at which the multilayer printed-circuit board is to be connected to a motherboard. That is, the density with which the via-holes are formed in each of the stacked circuit boards should preferably be smaller from the circuit board on which the electronic components such as LSI chip are to be mounted towards the circuit board at which the multilayer printed-circuit board is to be connected to the mother board. With this construction of the multilayer printed-circuit board, the wires can be routed more freely.

The conductor circuit formed on one or either side of the insulative substrate should preferably be formed from a copper foil by hot-pressing of a copper foil of 5 to 18 µm in thickness laid under a adhesive resin layer kept in a semi-hard state and then appropriately etching the copper foil.

The above hot pressing is effected at an appropriate temperature and under an appropriate pressure, and more preferably under a reduced pressure, to cure only the semi-hard adhesive resin layer. Thus the copper foil can be securely attached to the insulative resin layer, so the manufacturing time can be shortened as compared with the conventional circuit board using the prepreg.

The circuit board having such a conductor layer formed on either side of the insulative substrate can be used as a core of the multilayer printed-circuit board, and there should preferably be formed on the surface of the substrate corresponding to each via-hole lands (pads) as a part of the conductor circuit to have a diameter within a range of 50 to 250 µm.

The single-side circuit board having a conductor circuit formed on one side of the insulative substrate is used not only as a circuit board to be stacked with the double-sided circuit board but only the single-sided circuit boards may be stacked one on the other to form a multilayer printed-circuit board.

In such a single-sided circuit board, a projecting conductor should preferably be formed right above a filled via-hole.

The projecting conductor should preferably be formed from a conductive paste or a metal which melts at a low temperature. Since the conductive paste or low melting-point metal will thermally be deformed in the process in which circuit boards are stacked one on the other together and hot pressed, differences in height of the conductive substance filled in the via-holes and metal-plating layers can be reduced, so poor connection can be prevented from taking place, whereby a multilayer printed-circuit board whose electrical connection is highly reliable can be provided.

The projecting conductor can be formed from the conductive substance filled in the via-hole, for example, the conductive paste, and in the same filling process.

As having been described in the foregoing, the conductive bump is formed right above the via-hole on the surface of a one, of the outermost circuit boards of the multilayer printed-circuit board, located on the side of the multilayer printed-circuit board, formed by stacking one on the other, and heating and pressing, on which electronic components such as LSI chip are to be mounted. The conductive bump is formed in a dot-matrix pattern or in a matrix pattern slightly shifted from the dot-matrix pattern, for example.

Also, the conductive pin or ball is formed right above the via-hole on the surface of the other one of the outermost circuit boards, which is to be connected to a mother board. The conductive pin or ball is formed in a dot-matrix pattern or in a matrix pattern slightly shifted from the dot-matrix pattern similarly to the conductive bump.

How to make the multilayer printed-circuit board and semiconductor device using the former, according to the present invention, will be described below with reference to the accompanying drawings.

(A) Forming the Circuit Board for Stacking (1) For making the multilayer printed-circuit board according to the present invention, an insulative substrate 10 having a copper foil 12 attached to one side thereof is used as a starting material for a circuit board being a basic unit of the multilayer printed-circuit board.

The insulative substrate 10 is formed from a hard insulative base material selected from glass epoxy resin, glass bismaleimide-triazine resin, glass polyphenylene ether resin, aramid nonwoven fabric-epoxy resin and aramid nonwoven fabric-polyimide resin. Of these materials, the glass epoxy rein should be used most preferably.

The insulative substrate 10 should desirably be 20 to 600 µm in thickness for the following reason. That is, if the thickness is less than 20 µm, the substrate 10 will have a lower strength and thus be difficult to handle and the reliability of its electrical insulation performance will be lower; on the other hand, if the thickness is over 600 µm, it will be difficult to form fine via-holes and fill a conductive substrate in the via-holes and the substrate thickness itself will be increased.

The copper foil 12 should desirably be 5 to 18 µm in thickness for the reason that when a laser machining (as will further be described later) is used to form a hole for a via-hole in the insulative substrate, if the copper foil 12 is too thin, the laser will penetrate through it while if the copper foil 12 is too thick, it will be difficult to form, by etching, a conductor circuit pattern of which the wire width is very small.

Especially, a prepreg formed from a glass cloth having an epoxy resin impregnated therein and in a B stage (semi-hard state) should preferably be used as the insulative substrate 10 and the prepreg and the copper foil 12 should preferably be stacked on each other and heated and pressed together to provide a single-sided coppered laminate. The reason why the single-sided coppered laminate is preferable is that while the laminate is being processed after the copper foil 12 is etched, the wiring pattern and via-hole position will not deviate. Namely, the positioning precision is assured to be high.

Figure 5:
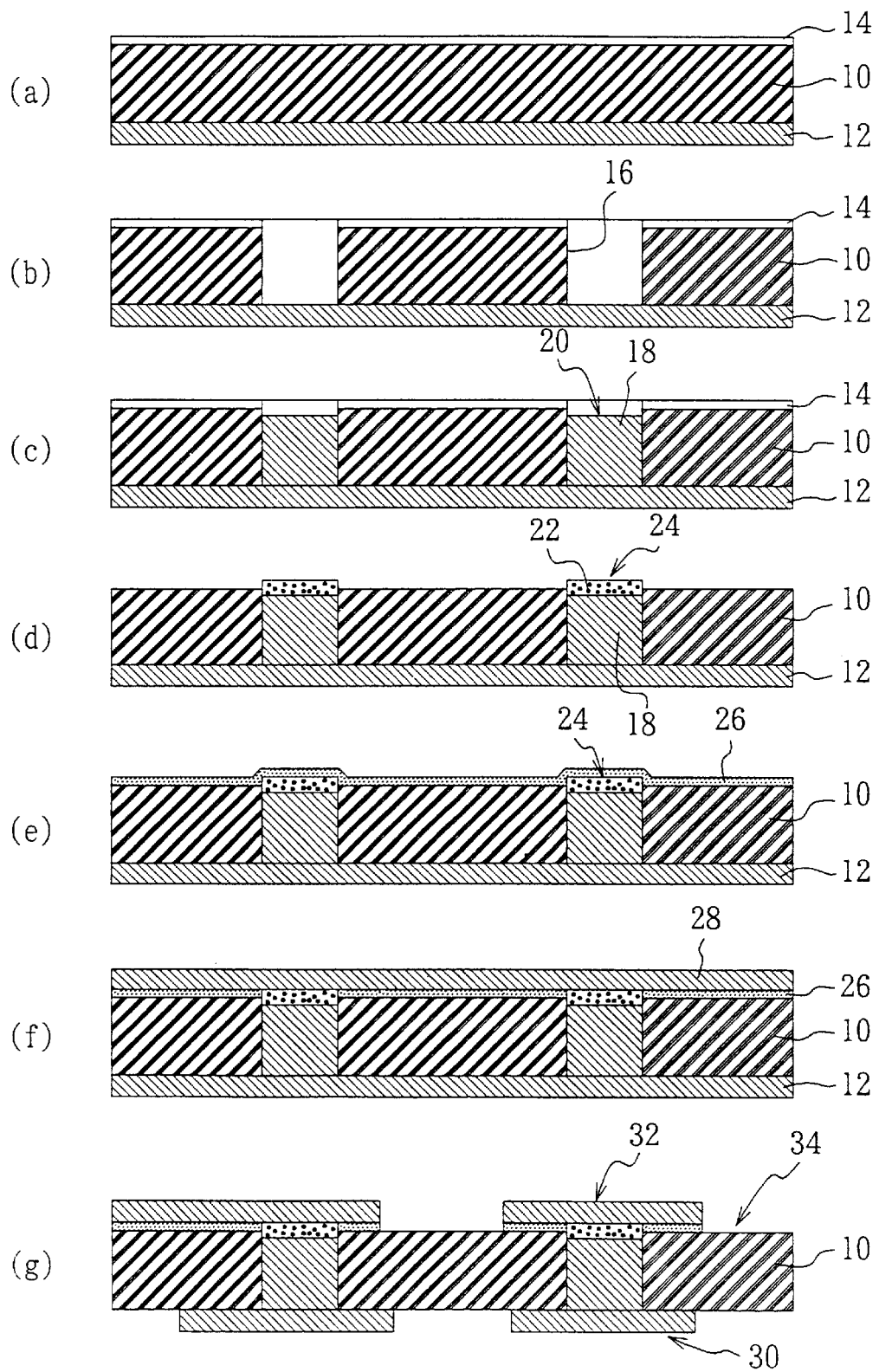
FIGS. 5(a) to 5(g) show a part of the process of manufacturing the singe-sided circuit board forming the multilayer printed-circuit board according to the present invention.

(2) Next, to make a multilayer printed-circuit board having a conductor layer formed on either side thereof, a protective film 14 is attached to the surface of the insulative substrate 10 opposite to the side on which the copper foil 12 has been attached. See FIG. 5(a).

The protective film 14 is used as a printing mask for a conductive paste which forms the projecting conductor which will further be described later. For example, a polyethylene terephthalate (PET) film having an adhesive layer provided on the surface thereof is usable as the protective film 14.

In the PET film, namely, the protective film 14, the adhesive layer should be 1 to 20 µm thick and the film itself be 10 to 50 µm thick.

(3) Further, a laser of carbon-dioxide gas is irradiated to the PET film 14 over the insulative substrate 10 to form a hole 16 through the PET film 14 to extend from the surface of the insulative substrate 10 to the copper film 12 (or conductor circuit patter). See FIG. 5(b).

The laser machining should desirably be effected with 1 to 50 shots of a laser having a pulse energy of 0.5 to 100 mJ, pulse width of 1 to 100 µs and a pulse interval of 0.5 ms or more, emitted from a pulse-oscillation type carbon-dioxide gas laser beam machine.

The via-hole diameter thus formed by the laser machining should desirably be 50 to 250 µm.

(4) To remove the resin residue on the wall and bottom of the hole 16 formed in the above step (3), a desmearing process is done.

The desmearing is an oxygen plasma discharging, corona discharging, ultraviolet laser machining or excimer laser machining. Especially, the ultraviolet laser or excimer laser should desirably be irradiated into the hole 16 to remove the smear because this method will assure a high reliability of the connection.

For example, when an ultraviolet laser using YAG third harmonic is used for this desmearing, the oscillating frequency should desirably be 3 to 15 kHz, pulse energy be 0.1 to 5 mJ and the number of shots be 5 to 30.

(5) Next, the desmeared substrate is plated with electrolytic copper using the copper foil 12 as a plating lead and under the following conditions to fill the hole 16 with an electrolytic copper-plating 18, thereby forming a filled via-hole 20. See FIG. 5c. As a result of this plating, a small clearance into which a conductive paste 22 which will further be described later is to be filled, will remain in an upper portion of the hole 16, and the electrolytic copper-plating 18 is filled into the clearance.

Electrolytic Copper Plating Solution

| | |
|---|---|
| $CuSO_4 \cdot 5H_2O$ | 65 g/l |
| Leveling agent (HL by ATOTEK) | 20 ml/l |
| Sulfuric acid | 220 g/l |
| Brightening agent (UV by ATOTEK) | 0.5 ml/l |
| Chlorine ion | 40 ppm |

Electro-plating Conditions

| | |
|---|---|
| Bubbling | 3.0 liters/min |
| Current density | 0.5 A/dm² |
| Set current value | 0.18 A |
| Plating length of time | 130 min |

(6) A clearance or concavity in the hole 16, having not been filled with the electrolytic copper-plating 18 in the above step (5), is filled with the conductive paste 22 taking the protective film 14 as the printing mask to form a conductive portion 24 (will be referred to as "projecting conductor" hereafter) projected for the thickness of the protective film 14 from the insulative substrate 10. See FIG. 5(d).

(7) Next, an adhesive layer 26 is formed on the surface of the insulative substrate 10 including the projecting conductor 24. See FIG. 5(e). The adhesive layer 26 is in a semi-hard state (B-stage) to attach the copper foil from which a conductor circuit patter is to be formed. It should preferably be an epoxy resin varnish and have a thickness of 10 to 50 μm.

(8) A copper foil 28 is heated and pressed to the surface of the insulative substrate 10 having the adhesive layer 26 provided thereon in the above step (7) to cure the adhesive layer 26. See FIG. 5(f).

At this time, the copper foil 28 is attached to the insulative substrate 10 with the cured adhesive layer 26 thereunder, and the projecting conductor 24 and copper foil 28 are thus electrically connected to each other. The copper foil should desirably be 5 to 18 μm thick.

(9) Next, an etching protective mask is attached to each of the copper foils 12 and 28 already attached to either side of the insulative substrate 10, and is covered with a predetermined circuit pattern mask. Thereafter, the insulative substrate 10 is subjected to etching to form conductor circuits 30 and 32 (including vialands). See FIG. 5(g).

In this step, first a photosensitive dry film is attached to the surface of each of the copper foils 12 and 28, it is exposed along a predetermined circuit pattern and developed to form an etching resist, and the metal layer on which the etching resist is not formed is etched to form the conductor circuit patterns 30 and 32 including the vialands.

The etching solution used in the above process should preferably be at least one selected from solutions of sulfuric acid-hydrogen peroxide, persulfate, cupric chloride and ferric chloride.

In a pre-processing step for forming the conductor circuits 30 and 32 by etching the copper foils 12 and 28, the entire surface of the copper foil can be pre-etched to reduce the foil thickness to 1 to 10 μm, more preferably, to 2 to 8 μm for easy formation of a fine pattern.

The vialand as a portion of the conductor circuit has an inside diameter which is substantially same as the via-hole diameter. The outside diameter of the vialand should preferably be within a range of 50 to 250 μm.

FIG. (10) Next, the surfaces of the conductor circuits 30 and 32 formed in the step (9) are roughened as necessary (the roughened surface is not illustrated) to form a double-sided circuit board 34.

The surface roughening is effected to improve the adhesion with the adhesive layer and prevent delamination during multilamination.

The surface roughening is done for example by soft etching, blackening (oxidation)-reduction, forming a needle-like plating copper-nickel-phosphorus alloy (INTERPLATE by Ebara-Yujilite) or roughening with an etching solution "MecEtchbond" (by Mec).

In this embodiment, the roughened layer should preferably be formed using an etching solution. For example, the surface of the conductor circuit may be roughened by etching using an etching solution prepared from a mixed solution of cupric complex and organic acid. Such an etching solution can solve the copper-made conductor circuit pattern in the presence of oxygen as in spraying or bubbling, and the solving reaction is estimated to proceed as follows:

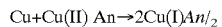

$$Cu + Cu(II) An \rightarrow 2Cu(I)An/_2$$

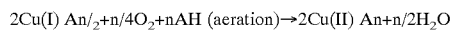

$$2Cu(I) An/_2 + n/4O_2 + nAH \text{ (aeration)} \rightarrow 2Cu(II) An + n/2H_2O$$

where A: Complexing agent; n: Coordination number.

As shown above, the cuprous complex is solved under the action of the acid and couples with the oxygen to produce cupric complex which will contribute to the oxidation of the copper again. The cupric complex used in the present invention should preferably be a cupric complex of any one of azoles. The etching solution of the organic an acid-cupric complex can be prepared by solving in water the cupric complex of an azole and organic acid (halogen ion as necessary).

The double-sided circuit board as basic composition of the multilayer printed-circuit board according to the present invention is made by effecting the above steps (1) to (10).

Figure 6:
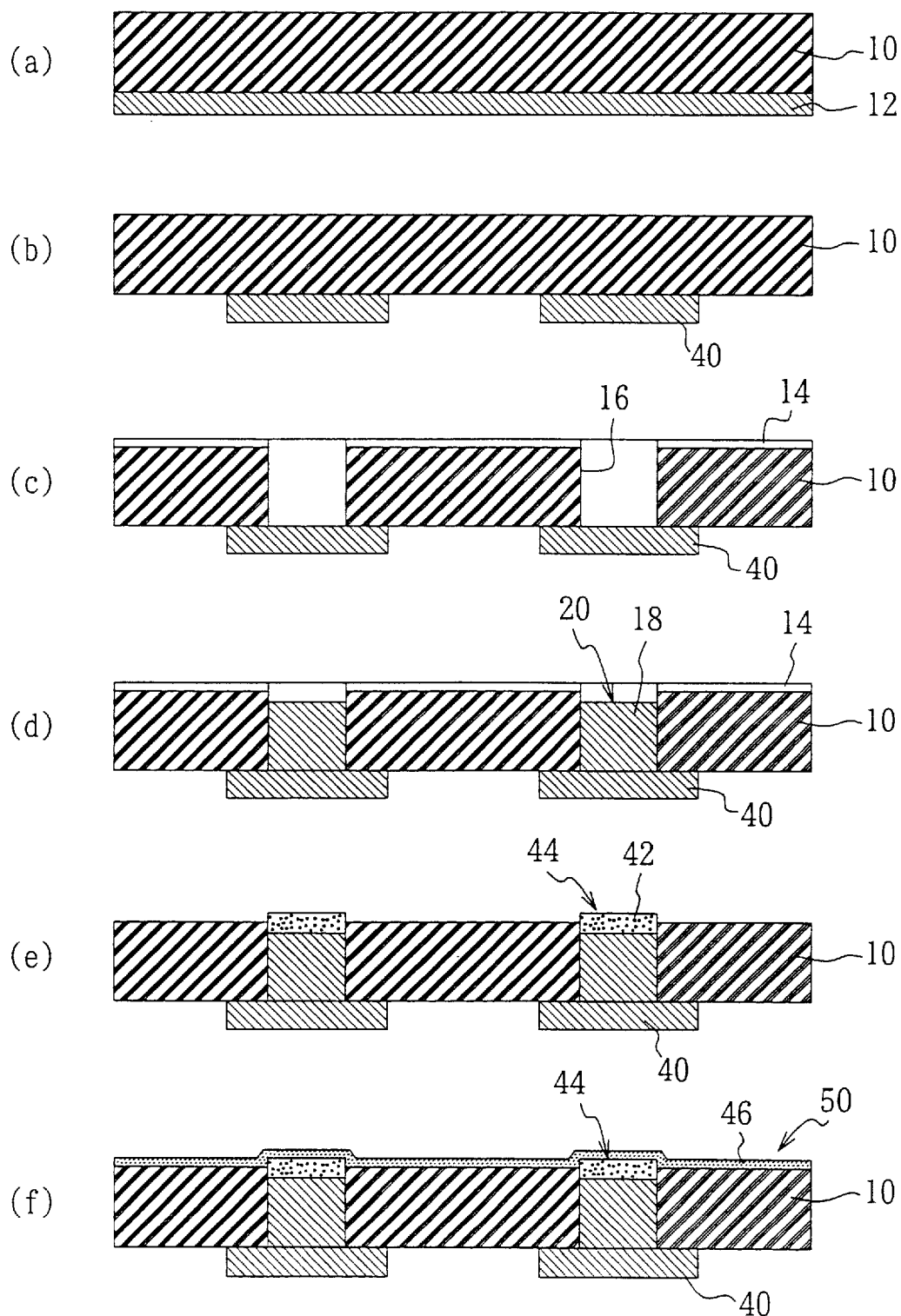
FIGS. 6(a) to 6(f) show a part of the process of manufacturing the singe-sided circuit board forming the multilayer printed-circuit board according to the present invention.

(11) Next, to make a single-side circuit board to be stacked on each of the front and rear sides of the above-mentioned double-sided circuit board, first an etching protective film is attached to a copper foil 12 (see FIG. 6(a)) attached to one side of an insulative substrate 10 and then covered with a predetermined circuit pattern mask. Thereafter, the copper foil 12 is etched to form a conductor circuit 40 (including vialands). See FIG. 6(b).

In the above process, first, a photosensitive dry film resist is attached to the copper foil 12, the resist is exposed and developed along the predetermined circuit pattern to form an etching resist, and a metal layer on which the etching resist is not formed is etched to form a conductor circuit pattern 40 including the vialands.

The etching solution used in the above process should preferably be at least one selected from solutions of sulfuric acid-hydrogen peroxide, persulfate, cupric chloride and ferric chloride.

In a pre-processing step for forming the conductor circuit 40 by etching the copper foil 12, the entire surface of the copper foil can be pre-etched to reduce the foil thickness to 1 to 10 $\mu$m, more preferably, to 2 to 8 $\mu$m for easy formation of a fine pattern.

(12) After the conductor circuit 40 is formed on one side of the insulative substrate 10, processing is effected as in the above steps (2) to (6), and then the PET film 14 is peeled from the surface of the insulative substrate 10. See FIGS. 6(*c*) to 6(*e*).

The height of projection of a projecting conductor 44 formed as in the step (6) (this projecting conductor is a different one from the projecting conductor 24 of the double-sided circuit board) from the surface of the insulative substrate 10 should desirably be substantially equal to the thickness of the protective film 14, namely, within a range of 5 to 30 $\mu$m.

The reason for the above is that if the projecting height is less than 5 $\mu$m, a poor connection will easily result while if it is more than 30 $\mu$m, the resistance will be higher and the projecting conductor 24 will spread too much along the surface of the insulative substrate when it is thermally deformed in the heating and pressing step, resulting in impossibility of forming a fine pattern.

Also, the projecting conductor 44 should desirably be precured for the reason that it is hard even in the B stage and it will possibly be in electrical contact with the conductor circuit (conductive pad) of the other circuit board to be stacked along with the circuit board having the projecting conductor 44 before the adhesive layer becomes soft are the steps of stacking and pressing.

The projecting conductor 44 is deformed when heated and pressed to have the area of contact thereof increased. Thus it can have the electrical resistance thereof lowered and the projecting conductors 44 will have the variation of height from one to another corrected.

(13) Next, an adhesive resin 46 is applied to the surface of the insulative substrate 10 including the projecting conductor 44. See FIG. 6(*f*).

The adhesive resin is applied, for example, to over the surface of the insulative substrate 10 including the projecting conductor 44 or to the surface not including the projecting conductor 44, and formed as an adhesive layer of a dry non-cured resin. The adhesive layer should preferably be precured since it becomes easier to handle. The adhesive layer's thickness should desirably be within a range of 5 to 50 $\mu$m.

The adhesive layer 46 should desirably be an organic adhesive. It should desirably be at least one selected from epoxy resin, polyimide resin, thermosetting polyphenylether (PPE), a compound of epoxy resin and thermoplastic resin, a compound of epoxy resin and silicon resin, and BT resin.

The non-cured resin being an organic adhesive can be applied using a curtain coater, spin coater, roll coater, spray coater or by screen-printing. Also, the adhesive layer may be formed by laminating an adhesive sheet, The single-sided circuit board 50 is formed to have the conductor circuit 40 provided on one side of the insulative substrate 10, the projecting conductor 44 whose a part of the conductive paste thereof is exposed, provided on the other side of the insulative substrate 10, and the adhesive layer 46 provided on the surface of the insulative substrate 10 including the projecting conductor 44. A plurality of such single-sided circuit boards is stacked one on the other and bonded to each other or stacked on and bonded to a previously formed double-sided circuit board 34 to form a multilayer printed-circuit board 60. The adhesive rein 46 should preferably be used in this stacking step.

(B) Making the Multilayer Printed-Circuit Board

Three single-sided circuit boards 50, 52 and 54 are stacked on the double-sided circuit board 34 formed through the steps in (A) to provide a four-layer assembly. The four-layer assembly is integrated with each other by a single press-molding at a temperature of 150 to 200° C. under a pressure of 1 to 4 MPa to form the multilayer printed-circuit board 60. See FIG. 7.

By the simultaneous pressing and heating under the above conditions, the adhesive layer 46 of each single-sided circuit board is cured to provide a strong adhesion between neighboring single-sided circuit boards. Note that the hot-press should optimally a vacuum hot-press.

In the above embodiment, one double-sided circuit board and three single-sided circuit board are used to form a four-layer printed-circuit board. Note however that the multilayer printed-circuit board may include 5, 6 or more such circuit boards.

(C) Providing the Conductive Dump, Conductive Pin or Ball

On the outermost one of the circuit boards in the multilayer printed-circuit board formed through the process (B), there is provided a conductive bump on which an electronic component such as LSI chip is mounted. On the other outermost circuit board, there is provided a conductive pin or ball which is connectable directly to a connection terminal (connector) or a conductive ball on a mother board. Thus, a package circuit board is constructed.

Figure 7:
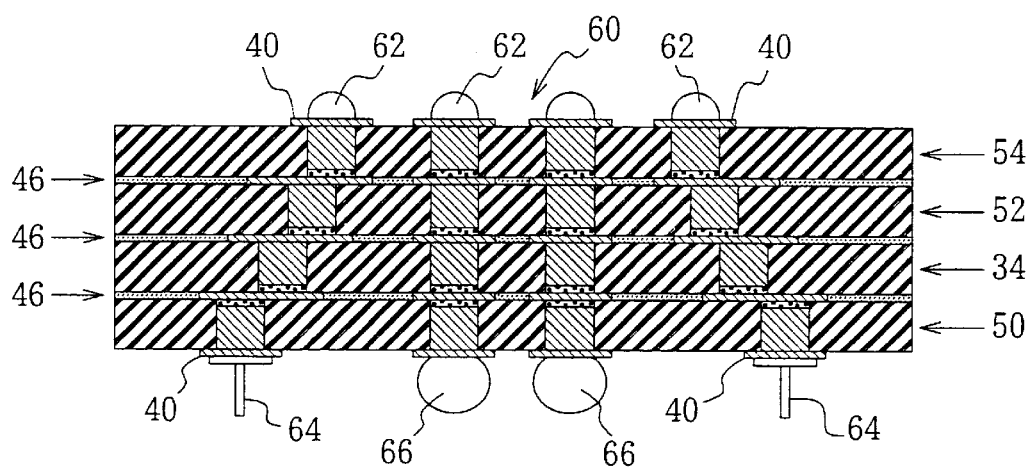
FIG. 7 shows one embodiment board (including a the single-sided circuit board and a double-sided circuit board) of the multilayer printed-circuit according to the present invention.

In the multilayer printed-circuit board 60 shown in FIG. 7 for example, the conductor circuits 40 of the outermost circuit boards 50 and 54 are exposed outside. In this multilayer printed-circuit board, an appropriate solder pad is provided right above each via-hole on each conductor circuit 40, and an appropriate solder is supplied onto the solder pad to form a conductive bump 62 or provide a conductive pin 64 or conductive ball 66.

Note that the solder used to form the conductive bump 62 should preferably be a tin/lead solder having a relatively low melting point (183° C.) or a tin/silver solder also having a relatively low melting point (220° C.), and the solder to connect the conductive pin 64 or conductive ball 66 should preferably be a tin/antimony solder, a tin/silver solder or a tin/sliver/copper solder, each having a relatively high melting point (230 to 270° C.).

Figure 8:
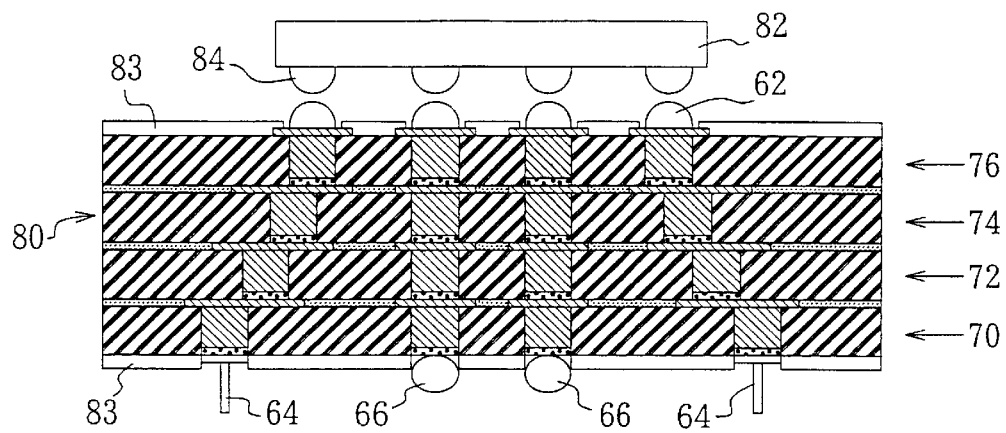
FIG. 8 shows another embodiment board (including only a the single-sided circuit board) of the multilayer printed-circuit according to the present invention.
Figure 9:
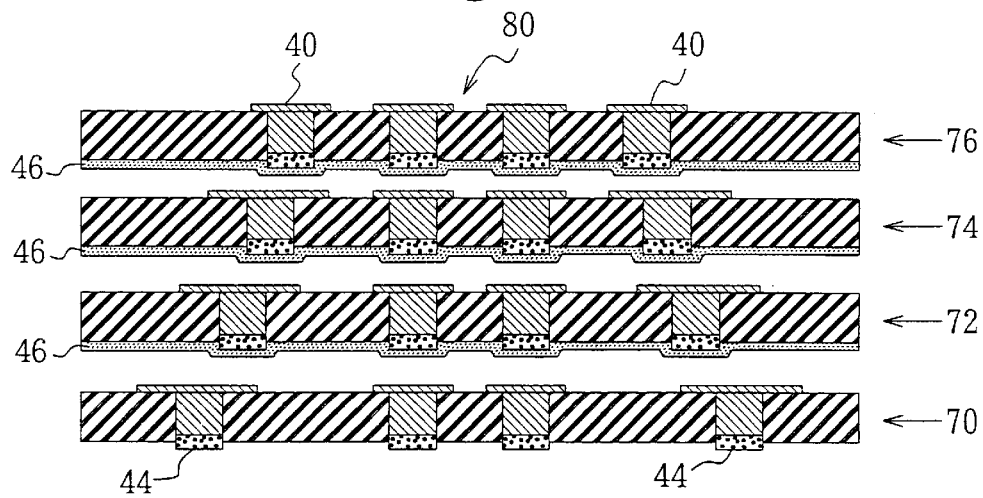
FIG. 9 explains the position of filled via-hole in the embodiment shown in FIG. 8.

In case there is used a multilayer printed-circuit board 80 formed by a single press-molding, under appropriate heating and pressing conditions, of a four-layer assembly of four single-sided circuit boards 70, 72, 74 and 76 stacked one on the other in this order as shown in FIG. 8, the projecting conductor provided beneath the via-hole on the outermost circuit board 70 is melted to form a substantially circular conductive pad on the surface of the insulative substrate 10 while a part of the conductor circuit 40 of the other circuit board 76, right above the via-hole on the conductor circuit 40, is formed as a conductive pad.

In this multilayer printed-circuit board 80, the bottommost circuit board 70 has connected to the conductive pad beneath the via-hole thereon the conductive pin 64 or conductive ball 66 which is to be connected to a connection terminal or solder ball of a mother board, and the topmost circuit board 76 has formed on the conductive pad formed a part of the conductor circuit 40 thereof the conductive bump 62 which is to be connected to a solder ball 84 of an electronic component 82 such as LSI chip.

As indicated with a dash line in FIG. 8, a solder resist layer 83 may be formed on the surfaces of the outermost circuit boards 70 and 76. In this case, a solder resist composition is applied to the surface, the film of the composition is dried, then a photo mask film on which holes are depicted is placed on the composition film. Then, the composition mask is exposed to light and developed to form holes in which the solder pad portion of the conductor circuit 40 is exposed, and the conductive bump 62, conductive pin 64 or conductive ball 66 is provided on the exposed solder pad portion.

According to this embodiment, there is provided a semiconductor device consisting of the multilayer printed-circuit board 80 including the conductive pad, pin or ball and the electronic component 82 mounted on the circuit board 80, or there is provided a semiconductor including the multilayer printed-circuit board 80 including such electronic component and a mother board to which the circuit board 80 is mounted.

Figure 10:
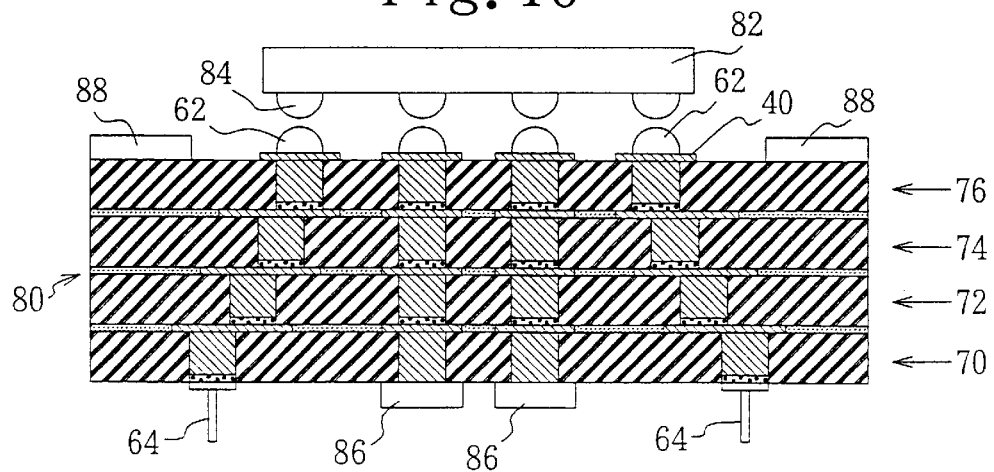
FIG. 10 shows one embodiment of the semiconductor device according to the present invention.

FIG. 10 shows another semiconductor device. In this semiconductor device, a chip capacitor 86 is connected and secured to the outermost one of the circuit boards 70 of the multilayer printed-circuit board 80 while a stiffener 88 to prevent warping is secured along the circumference of the other outermost circuit board 76.

In this semiconductor device, the chip capacitor 86 is formed from a highly dielectric material such as ceramic, barium titanate or the like and electrically connected to the via-hole beneath the electronic component 82 mounted to reduce the loop inductance.

The stiffener 88 is formed from a glass epoxy compound material such as BT, FR4 or FR5 and a metallic material such as copper to prevent warping of the semiconductor device due to a difference in thermal expansion between materials of the circuit boards.

Figure 11:
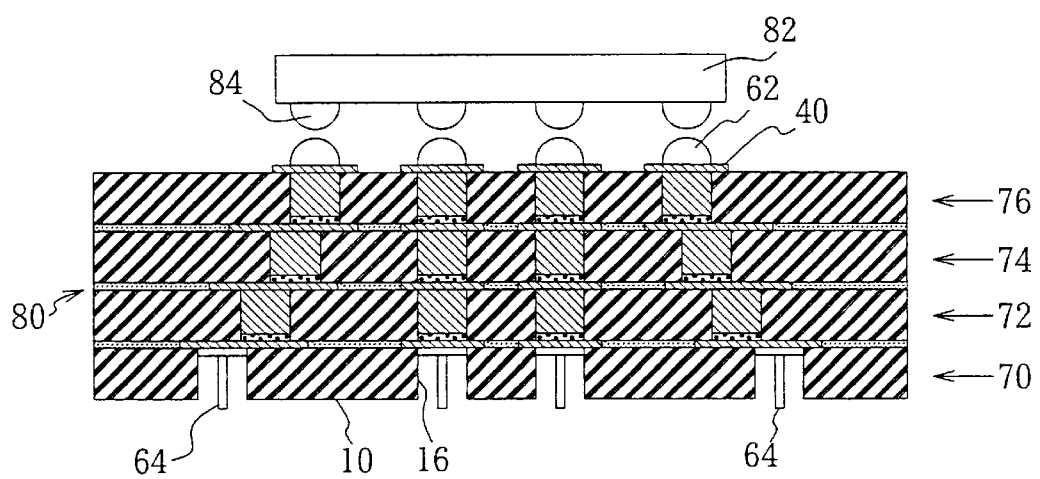
FIG. 11 shows another embodiment of the semiconductor device according to the present invention.

Furthermore, as shown in FIG. 11, the conductive bump 62 is formed on the conductive pad formed on the conductor circuit 40 of the outermost one of the circuit boards of the multilayer printed-circuit board 80, and the other outermost circuit board (lowest circuit board 70) is so constructed for no electrolytic copper-plating layer to enter the hole 16 formed in the insulative substrate 10. An appropriate solder is supplied to the conductor pad formed on the conductor circuit 40 exposed in the hole 16 to connect the conductive pin 64.

In the above construction, the conductive pin 64 is enclosed by the insulative substrate 10, and hence no solder resist layer has to be provided.

In the above embodiment, a metal layer consisting of nickel and gold should preferably be provided on each solder pad. The nickel layer should preferably be 1 to 7 $\mu$m thick and the gold layer be of 0.01 to 0.06 $\mu$m in thickness for the reason that a thickness of the nickel layer being larger than 7 $\mu$m will lead to an increased resistance while a thickness smaller than 1 $\mu$m will lead to an easier peeling from the solder pad, and a thickness of the metal layer being larger than 0.06 $\mu$m will lead to an increased manufacturing cost while a thickness smaller than 0.01 $\mu$m will lead to a reduced adhesion to the solder pad.

Solder is supplied onto the metal layer of the nickel and gold layers provided on the solder pad. The supplied solder is melted and solidified to form a conductive bump, or the conductive pin or ball is joined to the solder pad. Thus the multilayer printed-circuit board is formed.

The solder can be supplied to the metal layer by transfer or printing.

The solder transfer is as follows. A solder foil is attached to a prepreg and the solder foil is etched so as to leave not etched only a portion thereof corresponding to the hole, thereby forming a solder pattern in the solder foil. The solder foil having the solder pattern is used as a solder carrier film. After applied with a flux at a portion corresponding to the hole in the solder resist layer on the substrate, the solder carrier film is laminated on the metal layer for the solder pattern to be in contact with the conductive pad. Then, the solder carrier film is heated to transfer the solder to the metal layer.

On the other hand, the solder printing is such that a printing mask having an opening formed in a position corresponding to the conductive pad (metal mask) is placed on the substrate, a solder paste is printed and heated. The solder used may be a tin-silver alloy, tin-indium alloy, tin-zinc alloy or a tin-bismuth alloy.

(D1) Forming the Single-sided Build-up Wiring Layer

There will be described hereinbelow an embodiment of the present invention in which a build-up wiring layer is formed on one side of the multilayer printed-circuit board 60 formed through the above processes (A) and (B). The double-sided and single-sided circuit boards forming the multilayer printed-circuit board 60 will not be illustrated for the simplicity of the illustration. See FIG. 12(a).

(1) A roughened layer 63 of copper, nickel and phosphorus is formed on the surface of the conductor layer 40 on one side of the multilayer printed-circuit board 60 as shown in FIG. 12(b).

The roughened layer 63 is formed from electroless-plating material. The copper, nickel and hypophosphorous acid ion concentrations of the electroless-plating solution should desirably be $2.2 \times 10^{-2}$ to $4.1 \times 10^{-2}$ mol/l, $2.2 \times 10^{-3}$ to $4.1 \times 10^{-3}$ mol/l and 0.20 to 0.25 mol/l, respectively.

The above ion concentrations are preferable because the crystalline structure of a film precipitated in the above solution is a needle-like structure and has an excellent effect of anchoring. The electroless-plating solution may comprise a complexing agent and an additive in addition to the above compounds.

The roughened layer may be formed by plating with a needle-like copper-nickel-phosphorus alloy, oxidation-reduction or by etching the copper surface along the grain boundary.

(2) Next, an interlaminar insulative resin layer 65 is formed on the multilayer printed-circuit board 60 having the roughened layer 63 having been formed in the step (1) above. See FIG. 12(c).

The interlaminar insulative resin layer 65 may be formed by applying an insulative resin having previously been liquefied by adjustment of its viscosity by the use of a curtain coater, roll coater or printing, attaching a B-stage insulative resin film or by heating and pressing a sheet-formed insulative resin film.

The interlaminar insulative rein layer 60 should desirably be formed from at least a one selected from thermosetting resin, thermoplastic resin, photosensitive resin (including ultraviolet-setting resin as well), thermosetting resin whose part is acrylated, complex of thermosetting and thermoplastic resins and a complex of photosensitive and thermosetting resins. In addition, the resin may comprise a curing agent, reaction accelerator, photoreaction polymerizing agent, additive and a solvent.

The above thermosetting resin may be epoxy resin, phenol resin, polyimide resin, bismaleimide resin, polyphenylene resin, polyolefin resin or fluororesin.

The above epoxy resin may be a novolak type resin such as phenol novolak type, cresol novolak type, etc., a dicyclopentadiene-denatured alicyclic epoxy resin or the like.

For photosensitization with acryl resin or thermosetting resin by the above photosensitive resin, the thermosetting group of the thermosetting resin is reacted with methacrylic acid or acrylic acid for acrylation.

The above thermoplastic resin may be a phenoxy resin, polyether sulfon (PES), polysulfone (PSF), polyphenylene sulfide (PPS), polyphenylene sulfide (PPES), polyphenyl ether (PPE) or polyether imnide (PI).

The above resin complexes include a complex of thermosetting and thermoplastic resins and a composite of photosensitive and thermoplastic resins.

The above combination of thermosetting and thermoplastic resins includes a combination of phenolic resin and polyether sulfon, a one of polyimide resin and polysulfon, a one of epoxy resin and polyether sulfon, and a one of epoxy and phenoxy resins.

The above combination of photosensitive and thermoplastic resins includes a combination of an epoxy resin whose part of the epoxy group is acrylated and polyether sulfon, a one of acrylic and phenoxy resins, etc. For the resin complex of thermosetting resin (or photosensitive resin) and thermoplastic resin, the mixing ratio of them should be 95/5 to 50/50 since this ratio can assure a high toughness without loss of heat resistance.

The interlaminar insulative resin layer 64 may be composed of more than two layers. That is, the resin layer may be composed of two different resins. For example, the amount of the filler may be reduced to improve the insulation ability and a filler soluble in acid or oxidizer may be impregnated into the upper layer to improve the adhesion with the electroless-plating layer. The resin layer should desirably have a thickness of 20 to 70 $\mu$m. The most preferable thickness is 25 to 50 $\mu$m since it permits to provide an easy solution to both the insulation ability and adhesion.

In the above resin film, particles soluble in acid or oxidizer (will be referred to as "soluble particles" hereafter) are dispersed in a refractory resin. It should be reminded here that the terms "refractory" and "soluble" used herein are defined as follows for the purpose of description of the present invention. That is, a resin which is fast solved in a solution of acid or oxidizer will be called "soluble resin" while a one slowly solved will be called "refractory resin".

The soluble particles include for example resin particles soluble in acid or oxidizer (will be referred to as "Isoluble resin particles" hereafter), inorganic particles soluble in acid or oxidizer (will be referred to as "soluble inorganic particles" hereafter), metal particles soluble in acid or oxidizer (will be referred to as "soluble metal particles" hereafter), etc. These soluble particles may be used singly or two or more of them may be used in combination.

The soluble particles are not limited in shape, but they may be globular, crushed or in any other shape. The soluble particles should desirably be uniform in shape since they can form a rough surface with irregularities having a uniform roughness.

The mean size of the soluble particles should desirably be 0.1 to 10 $\mu$m. In case the particle size is within this range, the soluble particles may contain two or more kinds different in size from each other, such as soluble particles whose mean size is 0.1 to 0.5 $\mu$m and those whose mean size is 1 to 3 $\mu$m. Thereby, it is possible to form more complicated rough surface, which will assure an improved adhesion to the conductor circuit. Note that the size of the soluble particles refers herein to the length of the longest portion of a soluble particle.

The above soluble resin particles include thermoplastic resin particles, thermosetting resin particles, and any other ones soluble faster than the above-mentioned refractory resins when dipped in acid or oxidizer.

More specifically, the above soluble resin particles may be formed from one, or a mixture of two or more, selected from epoxy resin, phenol resin, polyimide resin, polyphenylene resin, polyolefin resin, fluororesin and the like.

Also, the soluble resin particles may be of rubber. The rubber includes for example polybutadiene rubber, various denatured polybutadiene rubbers such as epoxy-denatured, urethane-denatured and (meth)acrylonitrile-denatured ones, (meth)acrylonitrile butadiene rubber containing carboxyl group, etc. These rubbers can make the soluble resin particles more soluble in acid or oxidizer. Namely, the soluble resin particles can be solved in an acid other than a strong one, and in even permanganic acid having a relatively weak oxidizing. Also, the soluble resin particles can be solved in even chromic acid of a low concentration. Therefore, no acid or oxidizer will reside on the resin surface, so there is no likelihood that when a catalyst such as palladium chloride is added to the formed rough surface, the catalyst will not work or the catalyst will be oxidized.

The above soluble inorganic particles include those formed from at least a one selected from a group of for example aluminum compound, calcium compound, potassium compound, magnesium compound and silicide.

The above aluminum compound includes for example alumina, aluminum hydroxide etc., the calcium compound includes for example calcium carbonate, calcium hydroxide, etc., the potassium compound includes for example potassium carbonate, etc., the magnesium compound includes for example magnesia, dolomite, basic magnesium carbonate, etc., and the silicide includes for example siica, zeolite, etc. These compounds may be used singly or two or more of them may be used in combination.

The above soluble metal particle may be formed from at least a one selected from a group of copper, nickel, iron, zinc, gold, silver, aluminum, magnesium, calcium and silicon. Also, to assure an insulation, the soluble metal particles may be covered at the surfaces thereof with a resin or the like.

When two or more of the above-mentioned soluble particles are used as mixed, resin particles and inorganic particles should desirably be selected for combination for the reason that since both the resin particles and inorganic particles are low in conductivity, a desirable insulation of the resin film can be assured, the thermal expansion can easily be adjusted in relation to the refractory resin, no crack will take place in the interlaminar insulative resin layer formed from the resin film, and no separation will take place between the interlaminar insulative resin layer and conductor circuit.

The refractory resin is not limited to any special resin since it suffices to hold the rough surface when acid or oxidizer is used to form a rough surface on the interlaminar insulative resin layer. That is, the refractory resins include for example thermosetting resin, thermoplastic resin and a complex of the thermosetting and thermoplastic resins. Also, the refractory resin may be a photosensitive resin obtained by imparting the photosensitivity to the thermosetting or thermoplastic resin or the complex. Using the photosensitive resin, it is possible to form a hole for via-hole in the interlaminar insulative resin layer by exposure and development.

Among the above resins, the thermosetting resin is the most desirable one since it allows the rough surface to maintain its shape even when treated with a plating solution or various steps of heating.

More specifically, the refractory resin includes for example epoxy resin, phenol resin, polyimide resin, polyphenylene resin, polyolefin resin, fluororesin, etc. These resins may be used singly or two or more of them may be used in combination.

Further, epoxy resin having two or more epoxy groups in one molecule thereof is more desirable for use because it cannot only form the above-mentioned rough surface but it can prevent stress from concentrating on the metal layer even in a heat cycle since it has an excellent thermal resistance, thus causing no separation of the metal layer.

The above epoxy resin includes for example, epoxy resigns of cresol novolak type, bisphenol A type, bisphenol F type, phenol novolak type, alkylphenol novolak type, bisphenol F type, naphthalene type and dicyclopentadiene type, epoxy compound being a condensate of phenol and aromatic aldehyde having phenolic hydroxyl group, triglycidihisocyanurate, alicyclic epoxy resin, etc. These resins may be used singly or two or more of them may be used in combination which will assure an improved thermal resistance.

The resin film used herein should desirably be a one in which the soluble particles are substantially homogeneously dispersed in the refractory resin. This resin film can form a rough surface with irregularities having a uniform roughness. Even if via-holes and through-holes are formed in this resin film, the metal layer of the conductor circuit can be formed on the resin film with a high adhesion to the latter. Also, a resin film containing soluble particles may be used only in a surfacial portion on which the rough surface is to be formed. Since this resin film prevents other than the surfacial portion of the resin film from being exposed to acid or oxidizer, the insulation between the conductor circuits with the interlaminar insulative resin layer laid between them can be kept positively.

In the above resin film, the portion of the soluble particles dispersed in the refractory resin should desirably be 3 to 40% by weight of the whole resin film. If the proportion of the soluble particles is less than 3% by weight, the rough surface with desired irregularities cannot be formed in some cases. On the other hand, if the proportion of the soluble particles is more than 40% by weight, the soluble particles will be solved to a depth of the resin film when they are solved in acid or oxidizer, resulting that the insulation between the conductor circuits with the interlaminar insulative resin layer formed from the resin film cannot be maintained, which will cause a short-circuit between the conductor circuits.

In the resin film, the soluble particles should desirably contain a curing agent and other compositions in addition to the refractory resin.

The above curing agent includes for example imidazole curing agent, amine curing agent, carbamidine curing agent, epoxy adduct of these curing agents, microencapsulation of these curing agents, organic phosphine compound of triphenyl phosphine and tetraphenyl phosphonium/tetraphenyl borate, etc.

The content of the curing agent should desirably 0.05 to 10% by weight of the whole resin film. If the content is less than 0.05% by weight, the resin film will not be cured sufficiently so that acid or oxidizer will infiltrate into the resin film to a higher extent, possibly degrading the insulation of the resin film. On the other hand, if the content is over 10% by weight, the excessive curing agent will possibly modify the composition of the resin, possibly resulting in a lower reliability.

The above other compositions include a filler of an inorganic compound or resin which will not influence the forming of the rough surface. The inorganic compound includes for example silica, alumina, dolomite, etc. The resin includes for example polyimide resin, polyacryl resin, polyamide imide resin, polyphenylene resin, melanin resin, olefin resin, etc. By mixing any of these fillers in the resin film, it is possible to match the coefficient of thermal expansion and improve the heat resistance and chemical resistance, thereby improving the performance of the printed wiring board.

Also, the resin film may contain a solvent. The solvent includes for example ketones such as acetone, methyl ethyl ketone, cyclohexane, etc. and aromatic hydrocarbons such as ethyl acetate, butyl acetate, cellosolve acetate, toluene, xylene, etc. They may be used singly or two or more of them may be used in combination.

In the present invention, it is desired to use as the interlaminar insulative resin forming a via-hole 102 which will further be described later a to-be-electroless-plated adhesive layer containing a complex of thermosetting and thermoplastic resins in the form of a matrix. Also, a B-stage resin film may be used as laminated.

(3) After drying the to-be-electroless-plated adhesive layer formed in the above step (2), a hole 65a for a via-hole is formed in the interlaminar insulative resin layer 65. See FIG. 12(d).

When a photosensitive resin is used, it is exposed and developed, and then thermally set. In case a thermosetting resin is used, it is thermally set and then machined with laser to form the hole 65a for a via-hole in the adhesive layer (interlaminar insulative resin layer) 65.

(4) Next, the epoxy resin particles existent on the surface of the cured adhesive layer 65 are decomposed or solved in acid or oxidizer for removal, and the surface of the adhesive layer 65 is roughened to provide the rough surface 65b. See FIG. 12(e).

The acid used includes for example phosphoric acid, hydrochloric acid, sulfuric acid or an inorganic acid such as formic acid, acetic acid, etc. Among others, the organic acid is desirably be used since when he adhesive layer surface is roughened, the organic acid will not easily attack the metallic conductor layer exposed in the via-hole.

On the other hand, the oxidizer should desirably be a chromic acid, permanganate (including potassium permanganate etc.) or the lie.

(5) Next, a catalyst nucleus is imparted to the rough surface 65b of the adhesive layer 65.

To impart the catalyst nucleus, noble metal ion and colloid should desirably be used. Generally, palladium chloride and palladium colloid are used. Note that the catalyst nucleus should desirably be heated for fixation. Such a catalyst nucleus should be a palladium.

(6) Further, the surface of the (electroless-plated) adhesive layer 65 is electroless-plated to form an electroless-plating layer 67 over the entire rough surface. See FIG. 12(f). At this time, the electroless-plating layer 67 should preferably be 0.1 to 5 $\mu$m, and more preferably 0.5 to 3 $\mu$m.

Figure 13:
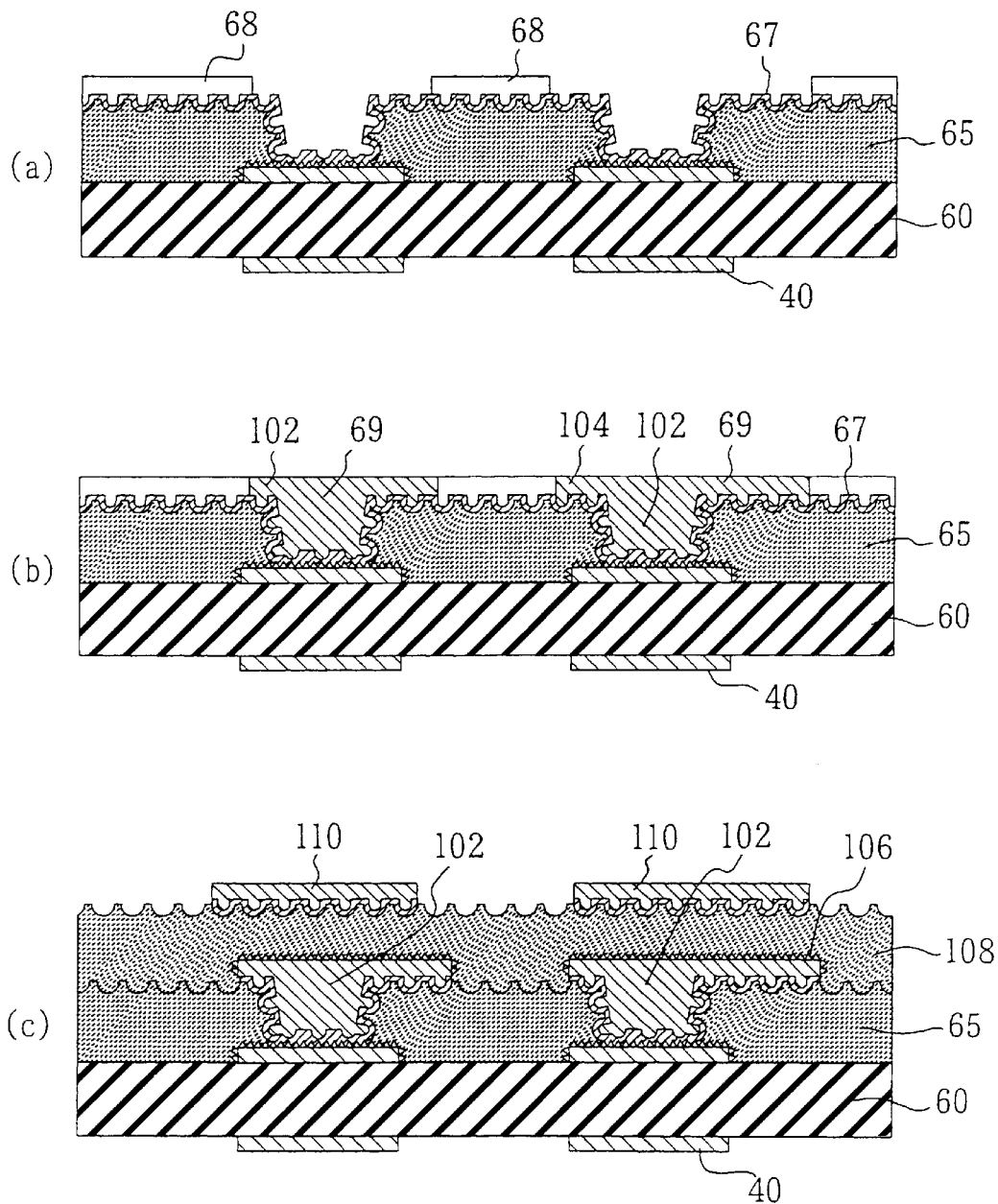
FIGS. 13(a) to 13(c) also show a part of the process of manufacturing the multilayer printed-circuit board.

Next, a plating resist 68 is provided on the electroless-plating layer 67. See FIG. 13(a). The plating resist composition should desirably be a composition of an acrylate of cresol novolak type epoxy resin or phenol novolak type epoxy resin and an imidazole curing agent. However, a commercially available dry film may be used instead.

(7) Furthermore, a portion, where no plating resist is provided, of the electroless-plating layer 67 is electro-plated to form a conductor layer which is to be on the upper conductor circuit 104 and fill the hole 65a with an electro-plating layer 69 in order to form a via-hole 102. See FIG. 12(b).

At this time, the electro-plating layer 67 exposed outside the hole 65a should desirably be 5 to 30 $\mu$m. The electro-plating material should desirably be a copper.

(8) Moreover, the plating resist 68 is removed, and then the electroless-plating layer under the plating resist is melted and removed with a mixed solution of sulfuric acid and hydrogen peroxide or an etching solution of sodium persulfate or ammonium persulfate, to make the upper conductor circuit 104 and filled via-hole 102 independent of each other.

(9) Next, a roughened layer 106 is formed on the surface of the upper conductor circuit 104.

The roughened layer 106 may be formed by etching, polishing, oxidizing and reducing, or plating.

First for the oxidation and reduction, respectively, an oxidation bath (blackening bath) is prepared from 20 g/l of NaOH, 50 g/l of NaClO$_2$ and 15.0 g/l of NaPO$_4$ and a reduction bath is prepared from 2.7 g/l of NaOH and 1.0 g/l of NaBH$_4$.

A roughened layer of copper-nickel-phosphorus alloy layer is formed from a precipitate during the electroless-plating.

The electroless-plating solution of the above alloy should desirably be a plating bath of 1 to 40 g/l of copper sulfate, 0.1 to 6.0 g/l of nickel sulfate, 10 to 20 g/l of citric acid, 10 to 100 g/l of hypophosphite, 10 to 40 g/l of boric acid, and 0.01 to 10 g/l of surfactant.

Furthermore, the surface of the roughened layer 106 is covered with a layer of a metal or noble metal whose reactivity (ionization tendency) is higher than that of copper and lower than that of titanium.

When the above metal is tin, a solution of tin boronfluoride and thiourea or of tin chloride and thiourea is used. At this time, an Sn layer of about 0.1 to 2 $\mu$m is produced due to the Cu—Sn substitution. When a noble metal is used, the surface of the roughened layer 106 may be covered with the noble metal by sputtering or evaporation.

(10) Next, there is formed on the substrate a to-be-electroless-plated adhesive layer 108 as an interlaminar insulative layer.

(11) Further, the above steps (3) to (9) are repeated to form another via-hole right above the via-hole 102 (not shown), and provide an upper conductor circuit 110 at a side outer than the upper conductor circuit 104. See FIG. 13(c). The surface of the upper conductor circuit 110 and the surface including the inner wall of the via-hole (not shown) are roughened to form a roughened layer 112.

Figure 14:
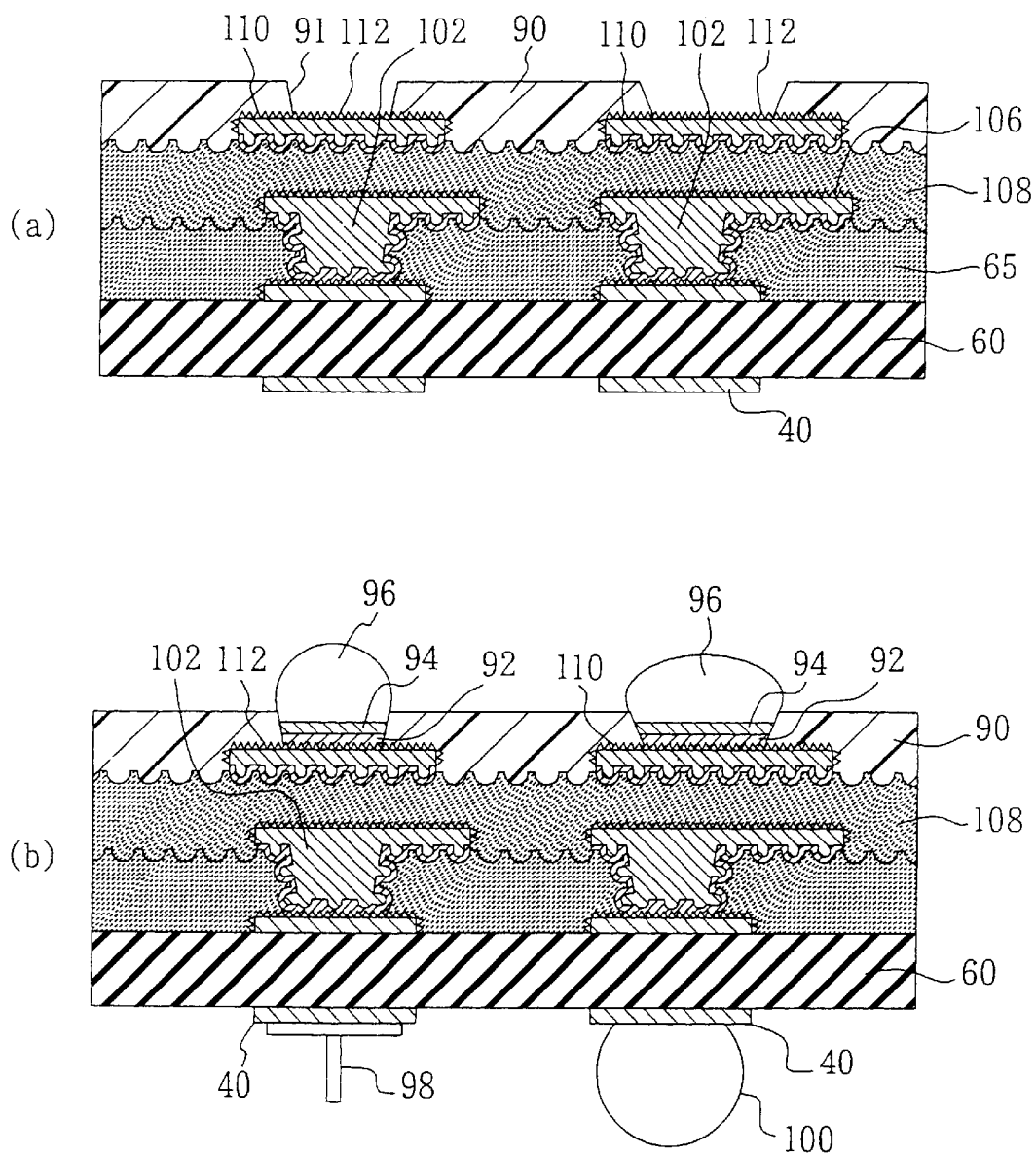
FIGS. 14(a) to 14(b) also show a part of the process of manufacturing the multilayer printed-circuit board.

(12) Next, a solder resist composition 90 is applied to cover the outermost surface of the build-up wiring layer thus formed, the solder resist layer is dried, a photomask film having holes depicted thereon is placed over the solder resist layer, and the solder resist layer is exposed and developed to form holes 91 in each of which a conductor portion of the conductor layer, which is to be a solder pad (including conductive pad and via-hole), is exposed. See FIG. 14(a).

The diameter of the hole 91 may be larger than that of the conductor portion which is to be the solder pad, and the conductor portion may be fully exposed. Also, the diameter of the hole 91 may be smaller than that of the conductor portion which is to be the solder pad, and the circumference of the conductor portion may be covered with the solder resist layer 90. In this case, the conductor portion to be the solder pad can be retained by the solder resist layer 90. Thus, preferably, the build-up wiring layer should finally be constructed to prevent the solder pad from separating.

(13) Further, a nickel-hold metal layer is formed on the conductor portion exposed from the hole 91 in the solder resist layer 90 to form the solder pad.

The nickel layer 92 should desirably be 1 to 7 $\mu$m in thickness while the gold layer 94 be 0.01 to 0.06 $\mu$m thick. If the nickel layer 92 is too thick, it will lead to an increased resistance. If the nickel layer 92 is too thin, it will easily be separable. On the other hand, the gold layer 94 being too thick will lead to an increased manufacturing cost while too small a thickness will result in a reduced adhesion to the solder pad.

(14) Further, solder is supplied onto the conductor circuit (solder pad) exposed from the hole 91 (upper hole) formed in the solder resist layer disposed at an outermost position of the build-up wiring layer formed on one side of the multilayer printed-circuit board to form a solder bump 96, and solder is supplied onto the conductor circuit 110 (solder pad) exposed on the surface of the multilayer printed-circuit board, where no build-up wiring layer is formed, to form a T pin 98 or solder ball 100. Thus, a multilayer printed-circuit board is produced. See FIG. 14(b).

The solder may be supplied by transfer or printing.

The solder transfer is as follows. Namely, a solder foil is attached on a prepreg, the solder foil is etched with only a portion thereof corresponding to the hole being not etched, to form a solder pattern. This solder pattern is taken as a solder carrier film. A flux is applied to a portion corresponding to the hole in the solder resist layer of the circuit board, and then the solder carrier film is stacked on the flux for the solder pattern to be in contact with the solder pad. The solder carrier film is heated to transfer the solder to the solder pad. On the other hand, the solder printing is as follows. That is, a printing mask (metal mask) having through-holes formed therein is placed on the circuit board in a position corresponding to the solder pad, a solder paste is printed and heated. The solder may be a tin-silver alloy, tin-indium alloy, tin-zinc alloy or a tin-bismuth alloy.

Note that the solder used to form the conductive bump 96 should preferably be a relatively low melting-point tin/lead solder (which melts at 183° C.) or tin/silver solder (which melts at 220° C.) and the solder used to connect a conductive pin 98 and conductive ball 100 should preferably be a relatively high melting-point tin/antimony solder, tin/silver solder or tin/silver/copper solder, whose the melting point is 230 to 270° C.

(D2) Forming Double-sided Build-up Wiring Layer

Figure 17:
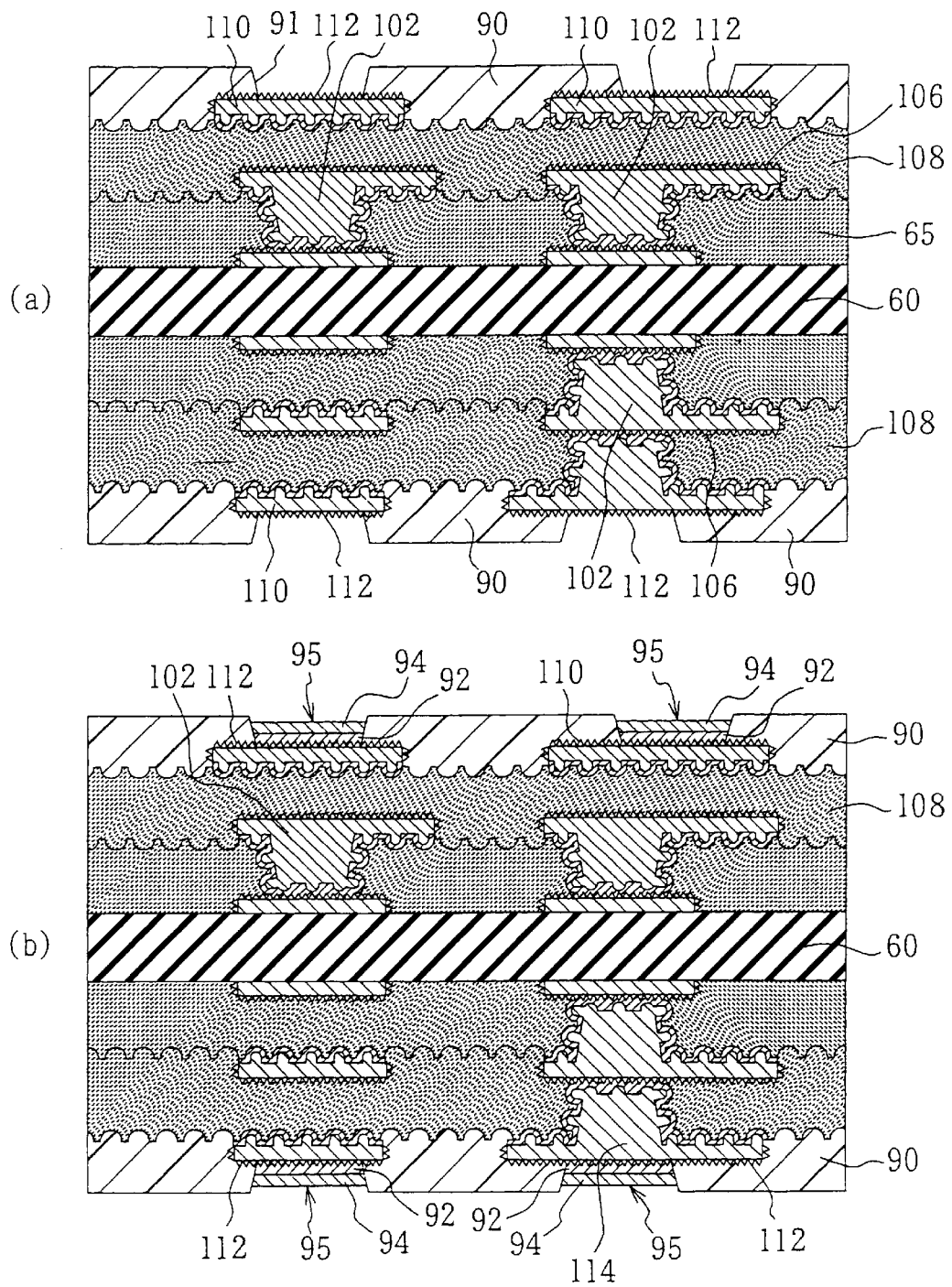
FIGS. 17(a) to 17(b) also show a part of the process of manufacturing the multilayer printed-circuit board according to the present invention.

The core multilayer circuit board 60 formed through the processes (A) and (B) and having the build-up wiring layer formed on either side thereof is subjected to the steps (1) to (12) for forming the single-sided build-up wiring layer as in the process (D1). See FIG. 17(*a*). Then, the solder pad 95 consisting of the nickel layer 92 and gold layer 94 is formed on a portion of the outermost conductor circuit 110 of the build-up wiring layer, thereby producing a multilayer printed-circuit board suitable for use as a mother board. See FIG. 17(*b*).

Figure 18:
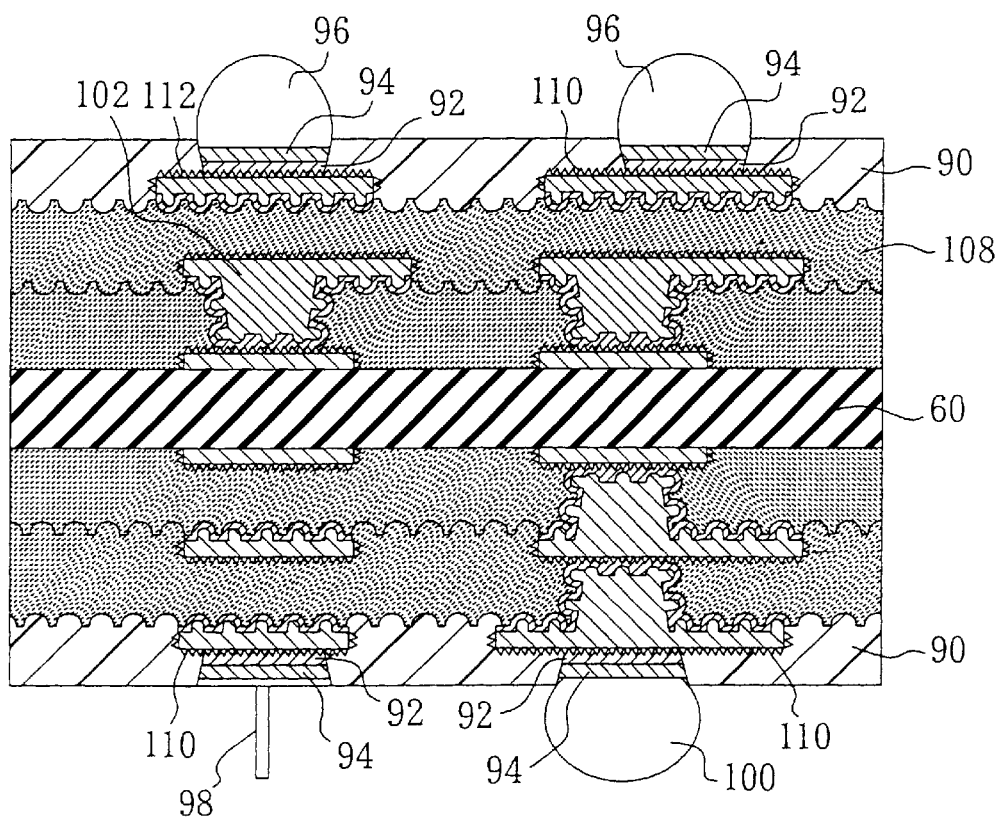
FIG. 18 shows a variant of the embodiment shown in FIG. 17(b) (having BGA and PGA disposed on the multilayer printed-circuit board in FIG. 17(b)).

Further, solder is supplied onto the solder pad 95 formed on the outermost conductor circuit 110 formed on one side of the double-sided build-up wiring layer to form the solder bump 96, while solder is supplied onto the solder pad 95 formed on the outermost conductor circuit 110 formed on the other side of the double-sided build-up wiring layer to provide the T pin 98 or solder ball 100, whereby producing a multilayer printed-circuit board suitable for use as a package circuit board on which electronic components can be mounted with a high density. See FIG. 18.

The present invention will further be described herebelow concerning examples thereof.

EXAMPLES

Example 1

(1) First, a double-sided circuit board forming a multilayer printed-circuit board was prepared. The double-sided circuit board used a single-sided coppered laminate, as a starting material, formed by heating and pressing a copper foil and a B-stage prepreg formed by impregnating a glass cloth with epoxy resin.

The insulative substrate 10 in the single-sided coppered laminate is 75 $\mu$m thick and the copper foil 12 was 12 $\mu$m thick. The adhesive layer of 10 $\mu$m in thickness was provided on each of the surface where the copper foil was formed and opposite surface of the laminate, and the PET film 14 of 12 $\mu$m was laminated on each of the adhesive layers.

(2) Next, the PET film 14 was illuminated with the carbon-dioxide gas laser to form the hole 1*t* for via-hole, extending through the PET film 14 and insulative substrate 10 to the copper foil 12, and the inside of the hole 16 was illuminated with the ultraviolet laser for the purpose of desmearing.

In this embodiment, the hole for via-hole was formed using a high-peak short-pulse oscillation type carbon-dioxide gas laser beam machine (by Mitsubishi Electric). The glass epoxy resin substrate of 75 $\mu$m in thickness, on the resin layer of which the PET film of 22 $\mu$m in total thickness is laminated, was illuminated with a laser beam from the PET film side by the mask imaging method to form holes for via-holes of 150 $\mu$m in diameter at a rate of 100 holes/sec.

Also, to desmear the inside of the hole 16, an ultraviolet laser beam machine using the YAG third harmonic GT605LDX (by Mitsubishi Electric) was used to emit 10 shots of a laser beam at an oscillating frequency of 5 kHz and pulse energy of 0.8 mJ.

(3) The substrate thus desmeared was subjected to electrolytic copper-plating to form the copper foil 12 as a plating lead with a small gap left at the upper portion of the hole 16. The electrolytic copper-plating 18 was filled in the hole 16 to form the via-hole 20.

(4) Further, the conductive paste 22 was applied to the copper layer-plating 18 filled in the hole 16 through the PET film 14 as the printing mask to form the projecting conductor 24 which projects for the thickness of the PET film 14 from the surface of the insulative substrate 10.

(5) Next, the PET film 14 was separated from the surface of the insulative substrate 10, and then epoxy adhesive was applied to the whole surface of the projecting conductor 24. The adhesive was dried at 100° C. for 30 min to form the adhesive layer 26 having a thickness of 20 $\mu$m.

(6) The copper foil 28 of 12 $\mu$m in thickness was put on the adhesive layer 26 formed in the step (5), and heated pressed at a temperature of 180° C. for 70 min under a pressure of 2 MPa and vacuum of $2.5 \times 10^3$ Pa.

(7) Thereafter, the copper foils 12 and 28 on both sides of the substrate were appropriately etched to form the conductor circuits 30 and 32 (including the vialands). Thus the double-sided circuit board 34 was prepared.

(8) Next, the single-sided circuit boards to be stacked were prepared. The circuit board used a similar single-sided coppered laminate to that used in the double-sided circuit board 34.

First, the copper foil 12 of the insulative substrate 10 was appropriately etched to form the conductor circuit 40, and the PET film 14 was laminated on the surface of the insulative substrate 10 opposite to the side where the conductor circuit 40 was formed.

(9) Thereafter, going through the above steps (2) to (5), the conductor circuit 40 was formed on one of the surfaces of the insulative substrate 10, the electrolytic copper-plating layer 18 was filled into the hole extending from the other surface of the insulative substrate 10 to the conductor circuit 40, the projecting conductor 44 was formed on the electrolytic copper-plating layer 18, and then the epoxy resin adhesive 46 was applied to the surface of the insulative substrate 10 including the projecting conductor 44.

The epoxy resin adhesive was precured to for the adhesive layers to be stacked one on the other. Three such single-sided circuit boards 50 were thus prepared.

(10) The double-sided circuit board 34 and three single-sided circuit boards 50, 52 and 54, having been prepared in the above steps (1) to (9), stacked in a predetermined position as shown in FIG. 3, and pressed together at a temperature of 180° C. using a vacuum hot press to prepare the multilayer printed-circuit board 60.

(11) Tin/antimony solder whose melting point is about 230° C. was used to connect the T pin 64 or solder ball 66 to the conductor circuit 40 of the lower one (50) of the outermost circuit boards of the multilayer printed-circuit board 60, and tin/lead solder whose melting point is about 183° C. was supplied to the conductor circuit 40 of the upper one (54) of the outermost circuit boards to form the solder bump 62, thus providing a multilayer printed-circuit board. With an electronic component 82 placed on the upper circuit board of the multilayer printed-circuit board, the tin/lead solder was reflowed at a temperature near its melting point to weld the solder ball 84 of the electronic component 82 to the solder bump 62, thus providing a semiconductor device comprising the multilayer printed-circuit board and electronic component.

Example 2

A multilayer printed-circuit board and semiconductor device were produced in the same manner as in the Example 1 except that four single-sided circuit boards were stacked in a predetermined position as shown in FIG. 1, and heated and pressed together to form a multilayer printed-circuit board, and that a solder bump was formed on the conductor circuit (conductor pad) of one outermost circuit board of the multilayer printed-circuit board and the T pin or solder ball was bonded to the solder pad formed by hot-pressing the projecting conductor exposed outside the other outermost circuit board.

Example 3

A multilayer printed-circuit board and semiconductor device were produced in the same manner as in the Example 1 except that a solder bump was formed on a solder pad formed on the conductor circuit of one outermost one of the four ingle-sided circuit boards, no electrolytic copper was filled in a hole formed in the insulative substrate of the other outermost circuit board and solder was supplied to a solder pad formed on the conductor circuit exposed inside the hole to connect the T pin (see FIG. 2).

Example 4

A multilayer printed-circuit board and semiconductor device were produced in the same manner as in the Example 3 except that a solder resist layer was provided on each of the front and rear outermost ones of four single-sided circuit boards and a solder bump was formed on a solder pad exposed from a hole formed in the solder resist layer (see FIG. 2).

Example 5

A multilayer printed-circuit board and semiconductor device were produced in the same manner as in the Example 3 except that a solder resist layer was provided on each of the front and rear outermost ones of four single-sided circuit boards and a solder bump was formed on a solder pad exposed from a hole formed in the solder resist layer (see FIG. 1).

Example 6

(1) Following the steps (1) to (10) for the Example 1, there was prepared a core multilayer circuit board 60 whose L/S=75 µm/75 µm, land diameter was 250 µm, via-hole diameter was 150 µm, conductor layer thickness was 12 µm and insulative layer thickness was 75 µm.

Figure 15:
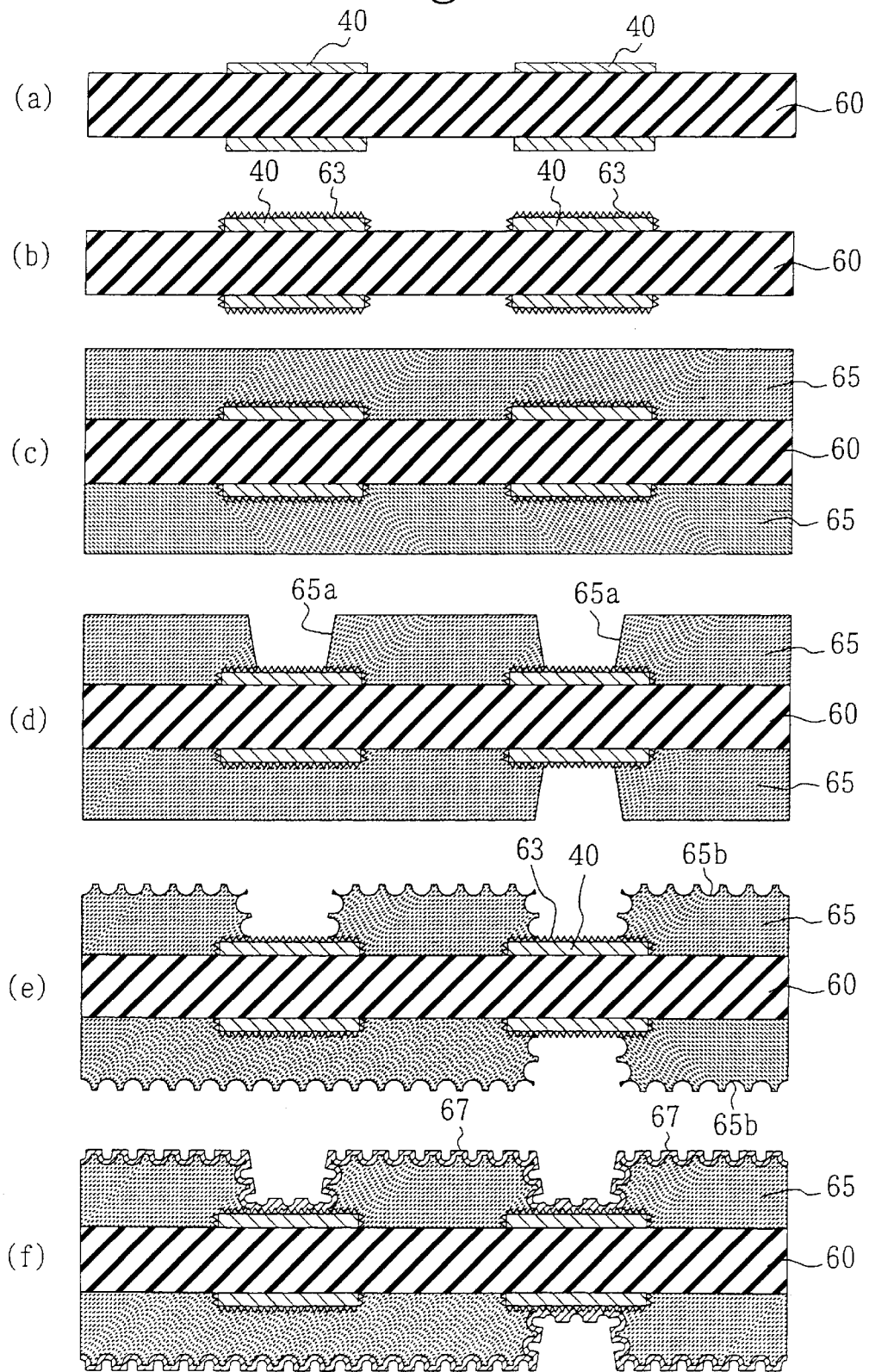
FIGS. 15(a) to 15(f) show a part of the process of manufacturing a yet another embodiment (having a build-up wiring layer formed on either side of the multilayer core board) of the multilayer printed-circuit board according to the present invention.

(2) Next, the core multilayer circuit board 60 having a conductor circuit 40 formed on either side thereof (see FIG. 15(a)) was dipped in an electroless-plating solution of 8 g/l of copper sulfate, 0.6 g of nickel sulfate, 15 g/l of citric acid, 29 g/l of sodium hypophosphite, 31 g/l of boric acid and 0.1 g/l of surfactant and of which pH=9, to thereby form on the surface of the conductor circuit 40 a 3-µm thick roughened layer 62 of copper, nickel and phosphorus. Then, the substrate was rinsed in water, and dipped in an electroless tin-substituted plating bath of 0.1 mol/l of tine boric fluoride and 1.0 mol of thiourea at 50° C. for one hour, thereby providing a tin layer of 0.3 µm in thickness on the surface of the roughened layer 63. See FIG. 15(b) (however, the tin layer is not illustrated).

(3) Compositions prepared through the following steps (a) to (b) were mixed together and agitated to prepare an electroless-plating adhesive.

(a) Thirty-five parts by weight of a 25% acrylated product of cresol novolac type epoxy resin (80% in sold content; 2500 in molecular weight, by Nippon Kayaku Co., Ltd.), 4 parts by weight of photosensitive monomer (ALLONIX M315 by Toa Gosei Co., Ltd.), 0.5 part by weight of antifoarming agent (S-65 by SANNOPCO) and 3.6 parts by weight of NMP, were mixed by agitation.

(b) Eight parts by weight of polyether sulfone (PES) and 7.245 parts by weight of epoxy resin particles (POLYMERPOL by Sanyo Kasei Co., Ltd.) of 0.5 µm in mean particle size were mixed together and then 20 parts by weight of NMP were added to the mixture. They were mixed by agitation.

(c) Two parts by weight of imidazole curing agent (2E4MZ-CN by Shikoku Kasei Co., Ltd.), 2 parts by weight of initiator (IRGACURE I-907 by Chiba Geigie), 0.2 part by weight of photosensitizer (DETX-S by Nippon Kayaku Co., Ltd.) and 1.5 parts by weight of NMP were mixed together by agitation.

(4) The electroless-plating adhesive prepared in the step (3) above was applied to the substrate 60 processed in the step (2) (see FIG. 15(c)), and dried to form an adhesive layer. A photomask film having black circles of 85 µm in diameter printed thereon was closely attached to either side of the substrate 60 where the dry adhesive layer was formed, and then exposed to a light of 500 mJ/cm$^2$ from an ultrahigh voltage mercury lamp. A solution of DMDG (diethylene glycol dimethyl ether) was sprayed to the photomask film and developed to form in the adhesive layer a hole 65a of 85 µm which becomes a via-hole. Further, the substrate was exposed to a light of 3000 mJ/cm$^2$ from the ultrahigh voltage mercury lamp, and heated at a temperature of 100°C. for 1 hour, and then at a temperature of 150° C. for 5 hours to form an interlaminar insulative substrate 65 (adhesive layer) of 35 µm in thickness, having high-precision holes corresponding to the black circles in the photomask film (see FIG. 15(d)). Note that the tin-plating layer was partially exposed in the hole 65a for via-hole.

(5) The substrate having the holes for via-holes 65 formed therein was dipped in a chromic acid solution for 20 min to solve and remove epoxy resin particles from the adhesive layer surface and roughen the surface of the adhesive layer 65 to a depth of about $R_{max}$=1 to 5 µm to form a roughened surface 65b, and thereafter dipped in a neutralization solution (by Siplay) and then rinsed in water.

(6) By adding a palladium catalyst (by ATOTEK) to the roughened layer 65b (roughened depth of 3.5 µm) on the adhesive layer surface, catalyst nucleus was imparted to the surfaces of the adhesive layer 65 and holes 65a for via-holes.

(7) The substrate was dipped in an electroless-plating bath whose composition is as follows to form an electroless copper-plating layer 67 of 0.6 µm in thickness on the whole rough surface (see FIG. 15(f)). At this time, there were found on the surface of the electroless copper-plating layer 67 the irregularities following those of the rough surface 65b of the adhesive layer 65 since the layer was thin.

Electroless-plating Solution

| | |
|---|---|
| NiSO4 | 0.003 mol/l |
| Tartaric acid | 0.20 mol/l |
| Copper sulfate | 0.03 mol/l |
| HCHO | 0.05 mol/l |
| NaOH | 0.10 mol/l |
| α, α'-bipyridyl | 40 mg/l |
| polyethylene glycol (PEG) | 0.1 g/l |
| [Electroless-plating conditions] | |
| Solution temperature | 33° C. |

Figure 16:
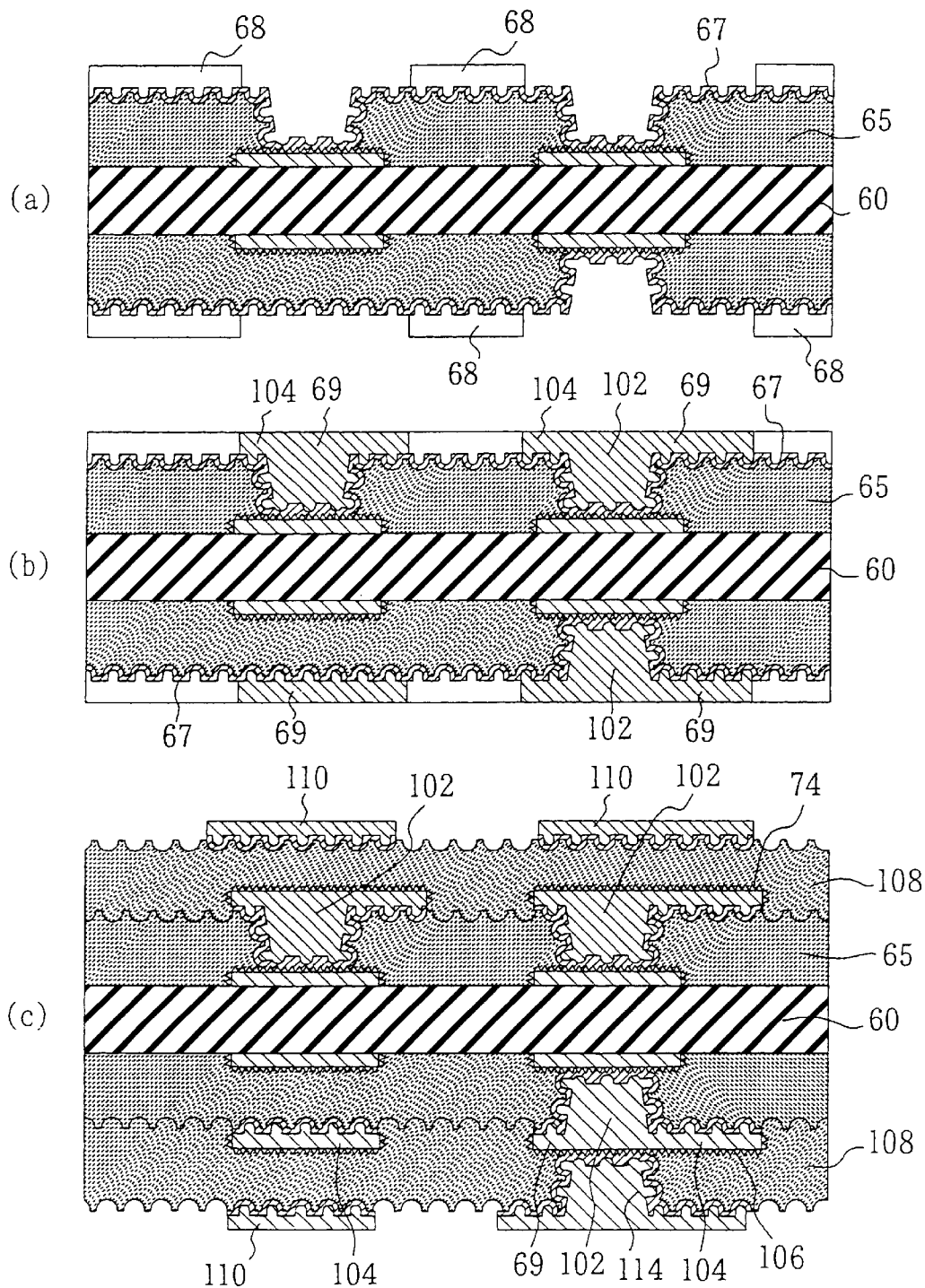
FIGS. 16(a) to 16(c) also show a part of the process of manufacturing the multilayer printed-circuit board according to the present invention.

(8) A commercially available photosensitive dry film was attached to the electroless copper-plating layer 67 formed in the step (7) above, and a mask was placed on the film, exposed to a light of 100 mJ/cm$^2$, and developed with in a 0.8% sodium carbonate solution to form a plating resist 68 of 15 µm in thickness. See FIG. 16(a).

(9) Next, a portion where no plating resist was formed was electro-plated under the following conditions to form an electro-plating layer 69 of 20 μm in thickness and provide a conductor layer where an upper conductor circuit 104 is to be formed, and form a via-hole 102 from the hole filled with a plating layer 69. See FIG. 16(b).

Electro-plating Solution

| CuSO$_4$ · 5H$_2$O | 60 g/l |
| Leveling agent (HL by ATOTEK) | 40 ml/l |
| Sulfuric acid | 190 g/l |
| Brightening agent (UV by ATOTEK) | 0.5 ml/l |
| Chlorine ion | 40 ppm |

Electro-plating Conditions

| Bubbling | 3.0 liters/min |
| Current density | 0.5 A/dm$^2$ |
| Set current value | 0.18 A |
| Plating length of time | 130 min |

(10) After the plating resist 68 was separated and removed, the electroless-plating layer 67 under the plating resist was melted and removed using a mixed solution of sulfuric acid and hydrogen peroxide or an etching solution of sodium persulfate or ammonium persulfate, to form an upper conductor circuit 104 consisting of the electroless-plating layer 67 and electrolytic copper-plating layer 69 and whose thickness was about 20 μm and L/S=25 μm/25 μm. At this time, the surface of the via-hole 102 was flat and the conductor circuit surface was level with the via-hole surface.

(11) A roughened layer 84 was formed on the substrate as in the above step (2), and the steps (3) to (10) were repeated to further form an upper interlaminar insulative resin layer 108 and conductor circuit 110 (including via-hole 80). Thus, a build-up wiring layer was formed on either side of the multilayer printed circuit board 60.

Note that the roughened layer 112 of copper, nickel and phosphorus was formed on the surface of the conductor circuit 110 but no tin-substituted plating layer was formed on the surface of the roughened layer 112.

(12) On the other hand, a solder resist composition was prepared by mixing 46.67 parts by weight of a photosensitive oligomer (4000 in molecular weight) produced by acrylating 50% of epoxy group of a 60% by weight of cresol novolak type epoxy resin (by Nippon Kayaku Co., Ltd.) solved in DMDG (diethylene glycol dimethyl ether), 14.121 parts by weight of a 80% by weight of bisphenol A type epoxy resin (EPICOAT 1001 by YUKA SHELL) solved in methyl ethyl ketone, 1.6 parts by weight of imidazole (2E4MZ-CN by SHIKOKU KASEI), 1.5 parts by weight of a polyvalent acryl monomer being a photosensitive monomer (R604 by Nippon Kayaku), 30 parts by weight of a same polyvalent acryl monomer (DPE6A by KYOEISHA KAGAKU), and 0.36 part by weight of leveling agent made from an acrylic ester polymer (POLYFLOW No. 75 by KYOEISHA KAGAKU), adding to this mixture 20 parts by weight of benzophenone as initiator (by KANTO KAGAKU) and 0.2 part by weight of EAB as photosensitizer (by HODOGAYA KAGAKU), and further adding 10 parts of weight of DMDG (diethylene glycol dimethyl ether) to the mixture to adjust the viscosity to 1.4±0.3 Pa·s at 25° C.

Note that the viscosity of the solder resist composition was measured using a B-type viscometer (DVL-B by Tokyo Keiki). For 60 rpm, No. 4 rotor was used with the viscometer. For 6 rpm, No. 3 rotor was used.

(13) The solder resist composition obtained in the step (12) was applied to a thickness of 20 μm on either side of the build-up wiring layer formed in the step (11). Next, the substrate was dried at 70° C. for 20 min, and then at 70° C. for 30 min, a soda lime glass substrate of 5 mm in thickness and having a chromium layer in which a pattern of circles for holes which were to be formed in the solder resist layer was depicted was exposed to an ultraviolet of 1000 mJ/cm$^2$ and developed in DMTG with the chromium layer closely attached to the solder resist layer. Further, the substrate was heated at 80° C. for 1 hour, 100° C. for 1 hour, 120° C. for 1 hour and at 150° C. for 3 hours to form a solder resist layer 90 (of 20 μm in thickness) whose pad portions are opened (to a diameter of 200 μm).

(14) Next, the substrate having the solder resist layer 90 formed thereon was dipped in an electroless nickel-plating solution of 30 g/l of nickel chloride, 10 g/l of sodium hypophosphite and 10 g/l of citric acid and whose pH=5 for 20 min to form a nickel-plating layer 92 of 5 μm in thickness at each hole. Further, the substrate was dipped in an electroless-plating solution of 2 g/l of potassium gold cyanide and 5 g/l of ammonium chloride, sodium citrate at 93° C. for 23 sec to form a gold-plating layer 94 of 0.03 μm in thickness on the nickel-plating layer 92.

Thereby, a solder pad 94 consisting of the nickel-plating layer 92 and gold-plating layer 94 was formed on the upper conductor layer 112, to prepare a multilayer printed circuit board suitably for use as a mother board having three single-sided circuit boards or six double-sided circuit boards. See FIG. 17(b).

In the multilayer printed-circuit board produced as in the above, the land of the via-hole in the core multilayer circuit board can be formed circular and the lands can be formed at a pitch of 600 μm. So, the via-holes can easily be formed with a high density. Also since an increased number of via-holes can be formed in the core multilayer circuit board, the conductor circuit in the core multilayer circuit board can electrically be connected to the conductor circuit in a build-up wiring board with a high reliability.

Further, the conductive ball (solder ball) on the package circuit board on which electronic components including semiconductor chips such as LSI is connected to the solder pad 95 provided at an outermost position of the build-up wiring layer. So, the package circuit board is advantageous for mounting of electronic components.

Example 7

A multilayer printed-circuit board was produced by forming the solder bump 96 on the solder pad 95 formed on one outermost upper conductor circuit 112 of the multilayer printed-circuit board produced as in the embodiment 6, and providing the T pint 98 or solder ball 100 on the solder pad 95 formed on the other outermost upper conductor circuit 112. See FIG. 18.

An electronic component such as LSI chip is connected to the multilayer printed-circuit board thus produced by means of the solder bump 96 provided onr the gold-plating layer 94 (solder pad) exposed from the hole in the solder resist layer 90 provided above the build-up wiring layer, and also the multilayer printed-circuit board is connected to the connection terminals of a mother board by means of the conductive pin 98 or conductive ball 100 provided on the gold-plating layer 94 (solder pad) exposed from the hole in the solder resist layer 90 provided under the build-up wiring layer.

Example 8

A multilayer printed-circuit board was produced in the same manner as in the Example 6 except that a conductive paste is filled into via-hole-oriented bores formed in the double- and single-sided circuit boards of the multilayer printed-circuit board to form via-holes and conductive paste is supplied onto the via-holes as in the same manner as in forming of the via-holes to form projecting conductors.

Example 9

A multilayer printed-circuit board was produced in the same manner as in the Example 6 except that an interlaminar insulative resin layer was formed by heating and pressing an epoxy resin film of 20 $\mu$m in thickness, forming via-hole-oriented holes of 60 $\mu$m in diameter by irradiating a carbon dioxide gas laser to the epoxy resin film and roughening the surface of the interlarninar insulative resin layer including the wall surface of the holes with a permanganic acid solution.

The epoxy resin film should desirably be a complex with a phenoxy resin, and it contained particles for forming a roughened layer.

Example 10

A multilayer printed-circuit board was produced in the same manner as in the Example 9 except that a conductive paste is filled into via-hole-oriented bores formed in the double- and single-sided circuit boards of the multilayer printed-circuit board to form via-holes and conductive paste is supplied onto the via-holes as in the same manner as in forming of the via-holes to form projecting conductors.

Example 11

A multilayer printed-circuit board was produced in the same manner as in the Example 6 except that a polyolefin resin film of 20 $\mu$m in thickness was heated and pressed to the interlarninar insulative resin layer, a carbon dioxide gas laser is irradiated to the polyolefin resin film to form via-hole-oriented holes of 60 $\mu$m in diameter, then an electroless-plating layer is formed while no surface roughening is done, and a copper sputtered layer or copper-nickel sputtered layer of 0.1 $\mu$m in thickness was formed by sputtering on the surface of the interlaminar insulative resin layer including the hole inner-wall surface.

Example 12

A multilayer printed-circuit board was produced in the same manner as in the Example 11 except that a conductive paste is filled into via-hole-oriented bores formed in the double- and single-sided circuit boards of the multilayer printed-circuit board to form via-hole s and conductive paste is supplied onto the via-holes as in the same manner as in forming of the via-holes to form projecting conductors.

Example 13

(1) Following the steps (1) to (10) for the Example 1, a core multilayer circuit board 60 was prepared of which LIS=75 $\mu$m/75 $\mu$m, land diameter was 250 $\mu$m, via-hole diameter was 150 $\mu$m, conductor layer thickness was 12 $\mu$m and insulative layer thickness was 75 $\mu$m.

Figure 12:
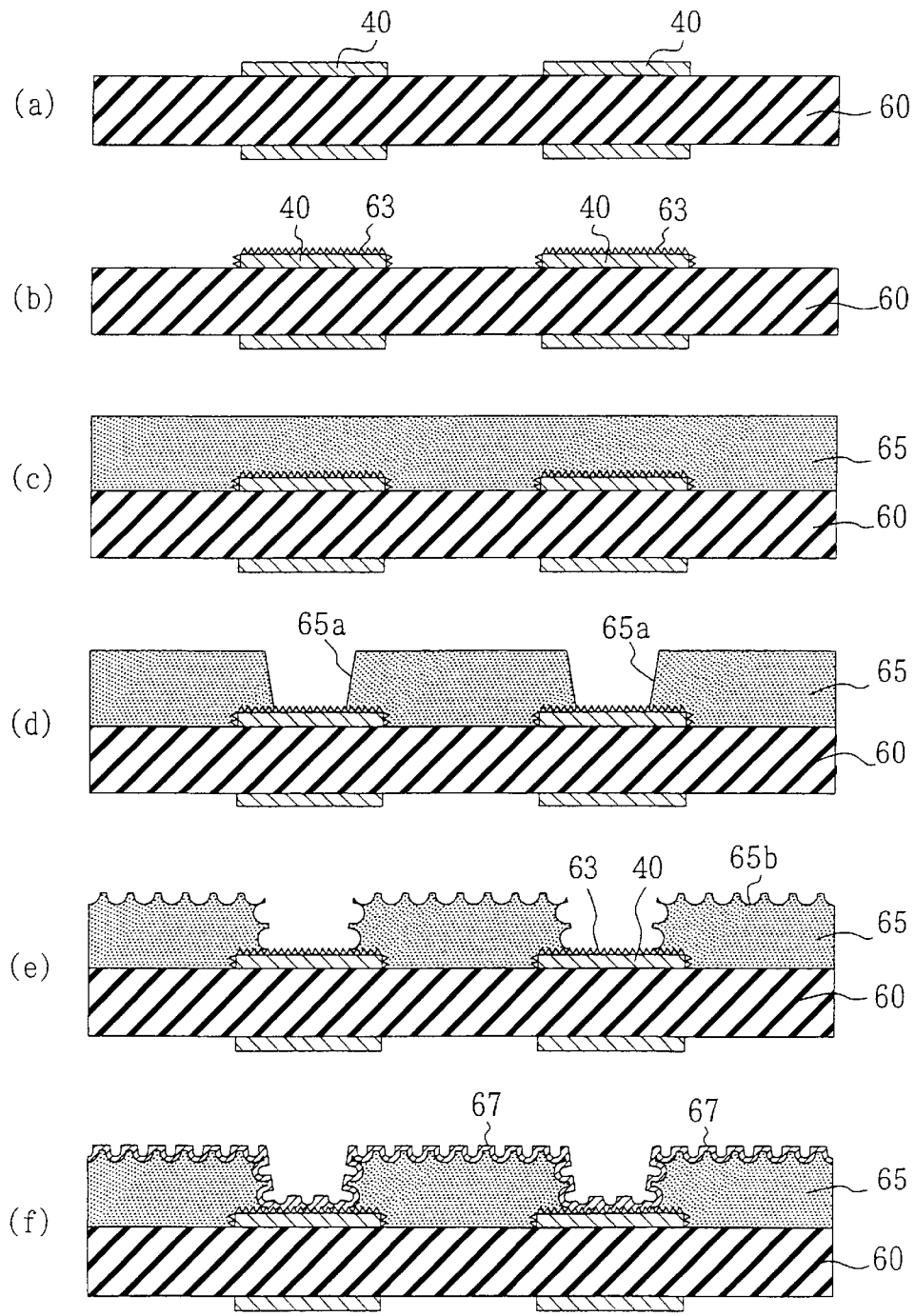
FIGS. 12(a) to 12(f) show a part of the process of manufacturing a still another embodiment (having a build-up wiring layer on one side of the multilayer core board) of the multilayer printed-circuit board according to the present invention.

(2) Next, the core multilayer circuit board having the conductor circuit 40 formed on either side thereof (see FIG. 12(*a*)) was subjected at one side thereof to the steps (2) to (14) for the Example 6 to form a build-up wiring layer on one side of the core multilayer circuit board 60, and form the solder pad 95 consisting of the nickel-plating layer 92 and gold-plating layer 94, exposed in the hole 91 in the solder resist layer 90 covering the upper conductor circuit 112.

(3) The solder bump 96 was formed on the solder pad 95, T pin 98 or solder ball 100 was provided on the conductor circuit 40 of the multilayer printed-circuit board 60, where no build-up wiring layer was formed, to thereby produce a multilayer printed-circuit board including three single-sided circuit boards, suitable for use as a package circuit board. See FIG. 14(*b*).

Example 14

A multilayer printed-circuit board was produced in the same manner as in the Example 13 except that a conductive paste is filled into via-hole-oriented bores formed in the double- and single-sided circuit boards of the multilayer printed-circuit board to form via-holes and conductive paste is supplied onto the via-holes as in the same manner as in forming of the via-holes to form projecting conductors.

Example 15

A multilayer printed-circuit board was produced in the same manner as in the Example 13 except that an interlaminar insulative resin layer was formed by heating and pressing an epoxy resin film of 20 $\mu$m in thickness, forming via-hole-oriented holes of 60 $\mu$m in diameter by irradiating a carbon dioxide gas laser to the epoxy resin film and roughening the surface of the interlaminar insulative resin layer including the wall surface of the holes with a permanganic acid solution.

The epoxy resin film should desirably be a complex with a phenoxy resin, and it contained particles for forming a roughened layer.

Example 16

A multilayer printed-circuit board was produced in the same manner as in the Example 15 except that a conductive paste is filled into via-hole-oriented bores formed in the double- and single-sided circuit boards of the multilayer printed-circuit board to form via-holes and conductive paste is supplied onto the via-holes as in the same manner as in forming of the via-holes to form projecting conductors.

Example 17

A multilayer printed-circuit board was produced in the same manner as in the Example 13 except that a polyolefin resin film of 20 $\mu$m in thickness was heated and pressed to the interlaminar insulative resin layer, a carbon dioxide gas laser is irradiated to the polyolefin resin film to form via-hole-oriented holes of 60 $\mu$m in diameter, then an electroless-plating layer is formed while no surface roughening is done, and a copper sputtered layer or copper-nickel sputtered layer of 0.1 $\mu$m in thickness was formed by sputtering on the surface of the interlaminar insulative resin layer including the hole inner-wall surface.

Example 18

A multilayer printed-circuit board was produced in the same manner as in the Example 17 except that a conductive paste is filled into via-hole-oriented bores formed in the double- and single-sided circuit boards of the multilayer printed-circuit board to form via-holes and conductive paste is supplied onto the via-holes as in the same manner as in forming of the via-holes to form projecting conductors.

COMPARATIVE EXAMPLES (1) An insulative substrate formed from a double-sided coppered laminate of 0.8 $\mu$m in thickness was used as a core substrate. A through-hole of 300 $\mu$m in diameter was drilled in the core substrate using a drill, then the core substrate was electroless-plated and electro-plated to form a conductor layer including the through-holes, and a roughened layer was provided on the entire surface of the conductor layer, a non-conductive filler was filled in the through-hole, dried and cured.

(2) Next, runover of the filler flash from the through-hole was removed, and the through-hole circumferential edge was flattened and thickened with an electroless-plating material and electroplating material applied thereto for forming parts which were to be a conductor circuit and a conductor layer which was to cover the filler filled in the through-hole.

(3) An etching resist was formed on the surface of the substrate on which the parts to be the conductor circuit and conductor layer covering the filler filled in the through-hole, the plating layer on which no etching resist was formed was removed by etching, and the etching resist was separated and removed to form an independent conductor circuit and a conductor layer which covered the filler.

Further, following the steps (2) to (14) for the Example 4, a multilayer printed-circuit board was prepared.

The Examples 1 to 5 were examined for the length of wiring from the electronic component such as LSI chip to the solder bump, BGA (ball grid array) or PGA (pin grid array), number of lands formed, and total area of the lands for comparison with the conventional printed wiring boards. As the result, it was found that the wiring length in the Examples 1 to 5 was 8/10 to 1/2 of that in the conventional printed wiring boards, the number of lands formed was 1.5 to 2.0 times larger, and that the land area was 2/3 to 8/10 of that in the conventional printed wiring boards, which proved that a high wiring density can be attained in the Examples 1 to 5. Especially, the Examples 4 and 5 were found to have an improved insulation as a package circuit board.

The Examples 6 to 18 were examined for the length of wiring from the electronic component such as LSI chip to the solder bump, BGA (ball grid array) or PGA (pin grid array) and the number of lands for comparison with the Comparative examples. The result of examination showed that the wiring length was 10 to 25% shorter than that in the Comparative examples, the number of core lands per unit area (cm$^2$) was 10 to 30% larger and that there were nothing affecting adversely the electrical properties and reliability of the Examples 6 to 18.

INDUSTRIAL APPLILCABILITY

As having been described in the foregoing, the present invention provides a multilayer printed-circuit board formed by heating and pressing together a plurality of single- or double-sided circuit boards, as a basic part, having a conductor circuit formed on one or either side of a hard insulative substrate, and via-holes formed by filing a conductive substance into a fine hole formed by illuminating with a laser from a surface of the hard insulative substrate opposite to the side on which the conductor circuit is formed. In the multilayer printed-circuit board, the wiring density can be considerably elevated. Since the circuit boards can be electrically connected to each other via the filled via-holes, without any through-holes, with a sufficient reliability, the multilayer printed-circuit board according to the present invention can be suitably used as a package circuit board on which electronic components such as LSI chip are to be mounted.

Further, the present invention provides a multilayer printed-circuit board using the above multilayer printed-circuit board as a core and having a build-up wiring layer provided on one or either side of the core multilayer circuit board. This multilayer printed-circuit board can advantageously be used not only as a package circuit board but as a mother board on which a packet board is mounted.

According to the present invention, a conductive bump is formed on one outermost circuit board of the multilayer printed-circuit board while a conductive pin or ball is provided on the other outermost circuit board. Namely, this construction is optimum for a package circuit board. Since conductive bumps, conductive pins or balls for electrical connection with electronic pacts or mother board can be formed with a high density, wiring can be made with a high density and also electronic components can be mounted with a high density. Also, since the multilayer printed-circuit board according to the present invention is constructed to moderate the stress, the wiring will not warp and the flatness of the T pins and conductive bumps can be assured.

What is claimed is:

1. A multilayer printed-circuit board formed by stacking a plurality of circuit boards on each other, each of said plurality of circuit boards including a hard insulative substrate comprising two sides, and at least one conductor circuit formed on at least one of said two sides, and a plurality of via-holes each comprising a hole formed through the hard insulative substrate extending to the at least one conductor circuit, and each filled with a conductive substance; applying an adhesive between the plurality of circuit boards, and heating and pressing the plurality of circuit boards together forming stacked circuit boards having two outermost circuit boards;
   one of the outermost circuit boards having formed on the surface thereof at least one conductive bump positioned right above a via-hole and electrically connected to the via-hole;
   the other outermost circuit board having formed on the surface thereof at least one conductive pin or ball positioned right above a via-hole and electrically connected to the via-hole; and
   a distance between neighboring via-holes formed in each of the circuit boards increases from one circuit board to another.

2. The multilayer printed-circuit board as set forth in claim 1, wherein one of the outermost circuit boards has formed on the surface thereof a solder resist layer covering the at least one conductor circuit, and right above the via-hole at least one conductive bump connecting to a conductive layer or via-hole exposed from a hole formed in the solder resist layer, and the other outermost circuit board has formed on the surface thereof a solder resist layer covering the at least one conductor circuit, and right above the via-hole at least one conductive pin or ball connecting to a conductive layer or via-hole exposed from a hole formed in the solder resist layer.

3. The multilayer printed circuit board as set forth in claim 1, wherein the conductive substance filled in the via-hole in each of the circuit boards forming together the multilayer printed-circuit board is a metal-plating layer formed by electro-plating, and at least one projecting conductor is electrically connected to the metal-plating layer.

4. The multilayer printed-circuit board as set forth in claim 3, wherein the projecting conductor is formed from a conductive paste.

5. The multilayer printed circuit board as set forth in claim 1, wherein the conductive substance filled in the via-hole in each of the circuit boards forming together the multilayer printed-circuit board is a conductive paste comprising metal particles and thermosetting or thermoplastic resin.

6. A semiconductor device including the multilayer printed-circuit board according to claim 1 and at least one electronic component electrically connected to the at least one conductive bump formed on the one of the outermost circuit boards of the multilayer printed-circuit board.

7. The semiconductor device as set forth in claim 6, wherein the circuit board on which at least one electronic component is mounted has a stiffener along the circumference thereof and at least one chip capacitor is electrically connected to the surface of the other outermost circuit board opposite to the outermost circuit board on which the at least one electronic component is mounted.

8. A multilayer printed-circuit board formed by stacking on each other:
- a plurality of single-sided circuit boards, each including a hard insulative substrate having at least one conductor circuit formed on one side thereof, and a plurality of via-holes each comprising a hole formed through the hard insulative substrate extending to the at least one conductor circuit, and each filled with a conductive substance; and
- a single-sided circuit board including a hard insulative substrate having at least one conductor circuit formed on one side thereof, and at least one through-hole formed through the hard insulative substrate extending to the at least one conductor circuit; and
- applying an adhesive between the single-sided circuit boards, and heating and pressing the single-sided circuit boards together forming stacked circuit boards having two outermost circuit boards;
- one of the outermost circuit boards having formed on the surface thereof at least one conductive bump positioned right above a via-hole and electrically connected to the via-hole; and
- the other outermost circuit board having formed on the surface thereof at least one conductive pin or ball positioned right above a via-hole and electrically connected to the via-hole; and
- a distance between neighboring via-holes formed in each of the circuit boards increases from one circuit board to another.

9. The multilayer printed circuit board as set forth in claim 8, wherein the conductive substance filled in the via-holes in each of the circuit boards forming together the multilayer printed-circuit board is a metal-plating layer formed by electro-plating, and at least one projecting conductor is electrically connected to the metal-plating layer.

10. The multilayer printed circuit board as set forth in claim 8, wherein the conductive substance filled in the via-holes in each of the circuit boards forming together the multilayer printed-circuit board is a conductive paste comprising metal particles and thermosetting or thermoplastic resin.

11. A semiconductor device including the multilayer printed-circuit board according to claim 8 and at least one electronic component electrically connected to the at least one conductive bump formed on the one of the outermost circuit boards of the multilayer printed-circuit board.

12. A multilayer printed-circuit board including a core multilayer circuit board having two sides and at least one inner conductor circuit, a build-up wiring layer formed on at least one of said two sides and from interlaminar insulative resin layers and conductor layers alternately stacked on each other, the conductor layers being connected to each other by at least one via-hole,
- the core multilayer circuit board being formed by stacking a plurality of circuit boards on each other, each of said plurality of circuit boards including a hard insulative substrate comprising two sides, and at least one conductor circuit formed on at least one of said two sides, and a plurality of via-holes each comprising a hole formed through the hard insulative substrate extending to the at least one conductor circuit, and filled with a conductive substance; and applying an adhesive between the plurality of circuit boards; a distance between neighboring via-holes formed in each of the circuit boards increases from one circuit board to another and said core multilayer circuit board having no through-holes penetrating the plurality of circuit boards.

13. The multilayer printed-circuit board as forth in claim 12, wherein the build-up wiring layer is formed on both sides of the core multilayer circuit board,
- an outermost conductor layer forming one of the build-up wiring layers having at least one solder bump formed on the surface thereof and another outermost conductor layer forming the other build-up wiring layer having at least one conductive pin or ball formed on the surface thereof.

14. The multilayer printed-circuit board as set forth in claim 12, wherein the build-up wiring layer is formed on both sides of the core multilayer circuit board,
- and outermost conductor layers forming the build-up wiring layer being covered with a solder resist layer and at least a part of the outermost conductor layer exposed from the hole formed in the solder resist layer being formed as a conductor pad or in the form of a connection terminal.

15. The multilayer printed-circuit board as set forth in claim 12, wherein the conductive substance is a metal-plating layer formed by electroplating and at least one projecting conductor is formed and electrically connected to the metal-plating layer.

16. The multilayer printed-circuit board as set forth in claim 15, wherein the projecting conductor is formed from a conductive paste.

17. The multilayer printed-circuit board as set forth in claim 12, wherein the conductive substance is a conductive paste comprising metal particles and thermosetting or thermoplastic resin.

18. The multilayer printed-circuit board as set forth in claim 12, wherein a part of the via-holes in the build-up wiring layer is positioned right above the via-holes formed in the core multilayer circuit board and connected directly to the via-holes.

19. The multilayer printed-circuit board as set forth in claim 12, wherein the insulative substrate of each of the circuit boards forming together the core multilayer circuit board comprises one of glass epoxy resin, glass bismaleimide-triazine resin, glass polyphenylene ether resin, aramid non-woven fabric-epoxy resin and aramid non-woven fabric-polyimide resin.

20. The multilayer printed-circuit board as set forth in claim 19, wherein the insulative substrate of each of the circuit boards forming together the core multilayer circuit board is formed from a glass epoxy resin of 20 to 100 $\mu$m in thickness and each filled via-hole has a diameter of 50 to 250 $\mu$m.

21. The multilayer printed-circuit board as set forth in claim 20, wherein the at least one via-hole in each of the circuit boards forming together the core multilayer circuit board is formed from a hole formed by illuminating the surface of the glass epoxy resin substrate with 1 to 50 shots of a carbon-dioxide gas laser whose pulse energy is 0.5 to 100 $\mu$mJ, pulse width is 1 to 100 $\mu$s, pulse interval is 0.5 ms or more.

22. A multilayer printed circuit board as set forth in claim 12, wherein the hard insulative substrate of each of the circuit boards forming together the core multilayer circuit board is formed from resin impregnated glass cloth material.

23. A semiconductor device including a multilayer printed-circuit board formed by stacking a plurality of circuit boards on each other, each of said plurality of circuits boards including a hard insulative substrate comprising two sides, and at least one conductor circuit formed on at least one of said two sides, a plurality of via-holes each comprising a hole formed through the hard insulative substrate extending to the at least one conductor circuit, and each filled with an electro-plating substance, and including at least one projecting conductor electrically connected to the via-hole; applying an adhesive between the plurality of circuit boards, and heating and pressing the circuit boards together forming stacked circuit boards having two outermost circuit boards, and electrically connecting at least one electronic component to one of said two outermost circuit boards of the multilayer printed-circuit board;

one of the outermost circuit boards having formed on the surface thereof at least one conductive bump positioned right above a via-hole and electrically connected to the via-hole, and the electronic component being electrically connected to the at least one conductive bump;

the other outermost circuit board opposite to the outermost circuit board on which the electronic component is mounted including on the surface thereof at least one chip capacitor electrically connected to the via-hole positioned beneath the electronic component; and a distance between neighboring via-holes formed in each of the circuit boards increases from one circuit board to another.

24. The semiconductor device as set forth in claim 23, wherein the circuit board on which the electronic component is mounted has a stiffener secured by bonding to the circumference thereof.

25. The semiconductor device as set forth in claim 23, wherein the at least one electronic component comprises an LSI chip.

26. A multilayer printed-circuit board formed by stacking a plurality of circuit boards on each other, each of said plurality of circuit boards including a hard insulative substrate comprising two sides, and at least one conductor circuit formed on at least one of said two sides, and a plurality of via-holes each comprising a hole formed through the hard insulative substrate extending to the at least one conductor circuit, and each filled with a conductive substance; applying an adhesive between the plurality of circuit boards, and heating and pressing the plurality of circuit boards together forming stacked circuit boards having two outermost circuit boards;

one of the outermost circuit boards having formed on the surface thereof at least one conductive bump positioned right above a via-hole and electrically connected to the via-hole;

the other outermost circuit board having formed on the surface thereof at least one conductive pin or ball positioned right above a via-hole and electrically connected to the via-hole; and a density with which the via-holes are formed in each said stacked circuit boards being smaller from the one of the outermost circuit boards on which an electronic component is to be mounted towards the other outermost circuit board adapted to be connected to a mother board.

27. A multilayer printed-circuit board formed by stacking on each other:

a plurality of single-sided circuit boards, each including a hard insulative substrate having at least one conductor circuit formed on one side thereof, and a plurality of via-holes each comprising a hole formed through the hard insulative substrate extending to the at least one conductor circuit, and each filled with a conductive substance; and a single-sided circuit board including a hard insulative substrate having at least one conductor circuit formed on one side thereof, and at least one through-hole formed through the hard insulative substrate extending to the at least one conductor circuit; and applying an adhesive between the single-sided circuit boards, and heating and pressing the single-sided circuit boards together forming stacked circuit boards having two outermost circuit boards;

one of the outermost circuit boards having formed on the surface thereof at least one conductive bump positioned right above a via-hole and electrically connected to the via-hole; and the other outermost circuit board having formed on the surface thereof at least one conductive pin or ball positioned right above a via-hole and electrically connected to the via-hole; and a density with which the via-holes are formed in each said stacked circuit boards being smaller from the one of the outermost circuit boards on which an electronic component is to be mounted towards the other outermost circuit board adapted to be connected to a mother board.

28. A semiconductor device including a multilayer printed-circuit board formed by stacking a plurality of circuit boards one each other, each of said plurality of circuits boards including a hard insulative substrate comprising two sides, and at least one conductor circuit formed on at least one of said two sides, a plurality of via-holes each comprising a hole formed through the hard insulative substrate extending to the at least one conductor circuit, and each filled with an electro-plating substance, and including at least one projecting conductor electrically connected to the at least one via-hole; applying an adhesive between the plurality of circuit boards, and heating and pressing the circuit boards together forming stacked circuit boards having two outermost circuit boards, and electrically connecting at least one electronic component to one of said two outermost circuit boards of the multilayer printed-circuit board, one of the outermost circuit boards having formed on the surface thereof at least one conductive bump positioned right above a via-hole and electrically connected to the via-hole, and the electronic component being electrically connected to the at least one conductive bump;

the other outermost circuit board opposite to the outermost circuit board on which the electronic component is mounted having on the surface thereof at least one chip capacitor electrically connected to the via-hole positioned beneath the electronic component; and a density with which the via-holes are formed in each said stacked circuit boards being smaller from the one of the outermost circuit boards on which an electronic component is to be mounted towards the other outermost circuit board adapted to be connected to a mother board.

* * * * *

UNITED STATES PATENT AND TRADEMARK OFFICE
CERTIFICATE OF CORRECTION

PATENT NO.    : 6,534,723 B1
DATED         : March 18, 2003
INVENTOR(S)   : M. Asai et al.

It is certified that error appears in the above-identified patent and that said Letters Patent is hereby corrected as shown below:

<u>Column 38,</u>
Line 53, "100μmJ" should be -- 100mJ --.

<u>Column 40,</u>
Line 28, "one" should be -- on --.

Signed and Sealed this

Fourteenth Day of October, 2003

JAMES E. ROGAN
*Director of the United States Patent and Trademark Office*